United States Patent
Kim

(10) Patent No.: US 10,141,916 B2
(45) Date of Patent: Nov. 27, 2018

(54) HIGH-SPEED FLIP-FLOP SEMICONDUCTOR DEVICE

(71) Applicant: SAMSUNG ELECTRONICS CO., LTD., Suwon-si, Gyeonggi-do (KR)

(72) Inventor: Min Su Kim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 91 days.

(21) Appl. No.: 15/245,239

(22) Filed: Aug. 24, 2016

(65) Prior Publication Data

US 2017/0063349 A1    Mar. 2, 2017

(30) Foreign Application Priority Data

Sep. 1, 2015  (KR) .................. 10-2015-0123745
Feb. 11, 2016  (KR) .................. 10-2016-0015527

(51) Int. Cl.
*H03K 3/12*    (2006.01)
*H03K 3/037*    (2006.01)
*H03K 19/20*    (2006.01)
*H03K 3/012*    (2006.01)

(52) U.S. Cl.
CPC ............. *H03K 3/037* (2013.01); *H03K 3/012* (2013.01); *H03K 19/20* (2013.01)

(58) Field of Classification Search
CPC ........ H03K 3/033; H03K 3/037; H03K 3/038; H03K 3/284; H03K 3/286; H03K 3/10; H03K 3/12; H03K 5/153; H03K 5/1534
See application file for complete search history.

(56) References Cited

U.S. PATENT DOCUMENTS

| | | | |
|---|---|---|---|
| 4,209,715 A * | 6/1980 | Aoki ................ | H03K 3/0372 326/100 |
| 4,620,118 A * | 10/1986 | Barber ................ | G06F 13/18 326/51 |
| 6,204,695 B1 | 3/2001 | Alfke et al. | |
| 6,573,754 B2 | 6/2003 | Menczigar et al. | |
| 6,906,554 B1 | 6/2005 | Chen | |
| 7,076,748 B2 | 6/2006 | Kapoor et al. | |
| 7,095,251 B2 | 8/2006 | Wilcox et al. | |
| 7,123,069 B2 * | 10/2006 | Minzoni ................ | G11C 7/22 327/216 |
| 7,546,559 B2 | 6/2009 | Kapoor et al. | |
| 7,576,582 B2 | 8/2009 | Lee et al. | |
| 7,694,042 B2 | 4/2010 | Lee et al. | |
| 7,902,878 B2 | 3/2011 | Saint-Laurent et al. | |
| 8,207,756 B2 | 6/2012 | Shionoiri et al. | |
| 8,434,047 B1 | 4/2013 | Jiang et al. | |

OTHER PUBLICATIONS

Martin Saint-Laurent et al., "A Low-Power Clock Gating Cell Optimized for Low-Voltage Operation in a 45-nm Technology", ISLPED'10, Aug. 18-20, 2010, pp. 159-163.

* cited by examiner

*Primary Examiner* — An Luu
(74) *Attorney, Agent, or Firm* — Volentine, Whitt & Francos, PLLC

(57) ABSTRACT

A semiconductor circuit includes a first logic gate that receives inputs of a first input signal, a clock signal and a feedback signal and performs a first logical operation to output a first output signal. A second logic gate that receives inputs of the first output signal of the first logic gate, the clock signal, and an inverted output signal of the first input signal and performs a second logical operation to output the feedback signal.

19 Claims, 23 Drawing Sheets

100

1200

1300

1400

HIGH-SPEED FLIP-FLOP SEMICONDUCTOR DEVICE

This application claims priority from Korean Patent Application No. 10-2015-0123745 filed on Sep. 1, 2015, and Korean Patent Application No. 10-2016-0015527 filed on Feb. 11, 2016, in the Korean Intellectual Property Office, the disclosures of which are incorporated herein by reference in their entirety.

BACKGROUND OF THE DISCLOSURE

1. Field of the Disclosure

The present disclosure relates to a semiconductor circuit.

2. Description of the Related Art

In order to design chips that operate at high speed, designs of a high-speed flip-flop and a high-speed clock gating circuit (or a clock gate) are important. Although existing D latch-based flip-flops and clock gating circuits occupy small areas and consume relatively little power, there are limitations due to a data-to-output latency (DQ latency) that is relatively too slow to be applied to the high-speed chip.

SUMMARY OF THE DISCLOSURE

Aspects of the present disclosure provide a semiconductor circuit that operates at high speed.

However, aspects of the present disclosure are not restricted to those set forth herein. The above and other aspects of the present disclosure that have not been mentioned will become more apparent to one of ordinary skill in the art to which the present disclosure pertains by referencing the detailed description of the present disclosure given below.

According to an aspect of the present disclosure, there is provided a semiconductor circuit including a first logic gate that receives inputs of a first input signal, a clock signal and a feedback signal and performs a first logical operation to output a first output signal. A second logic gate receives inputs of the first output signal of the first logic gate, the clock signal, and an inverted output signal of the first input signal and performs a second logical operation to output the feedback signal.

According to another aspect of the present disclosure, there is provided a semiconductor circuit including a first logic gate that receives inputs of a first input signal, a clock signal, and a feedback signal and performs a first logical operation to output a first output signal. A second logic gate receives inputs of a first input signal and a feedback signal and performs a second logical operation. A third logic gate receives inputs of a first output signal of the first logic gate, the clock signal, and an output signal of the second logic gate and performs a third logical operation to output the feedback signal.

According to still another aspect of the present disclosure, there is provided a semiconductor circuit including a first logic gate that receives inputs of a second input signal, a clock signal, and a feedback signal and performs a second logical operation to output a first output signal. The second input signal is generated by performing a first sub-logical operation on an inverted signal of the first output signal and a first input signal. A second logic gate receives inputs of the first input signal and the feedback signal to perform a first logical operation. A third logic gate receives inputs of a first output signal of the first logic gate, the clock signal, and an output signal of the second logic gate and performs a second logical operation to output the feedback signal.

According to still another aspect of the present disclosure, there is provided a semiconductor circuit having a logic circuit that receives a D signal and a clock signal and generates a feedback signal and an output signal based on the received D signal and clock signal. The output signal is an inverse digital representation of the clock signal when the D signal has a high digital state, and the feedback signal is an inverse digital representation of the clock signal when the D signal has a low digital state.

These and other aspects, embodiments and advantages of the present disclosure will become immediately apparent to those of ordinary skill in the art upon review of the Detailed Description and Claims to follow.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE DISCLOSURE

Figure 1:
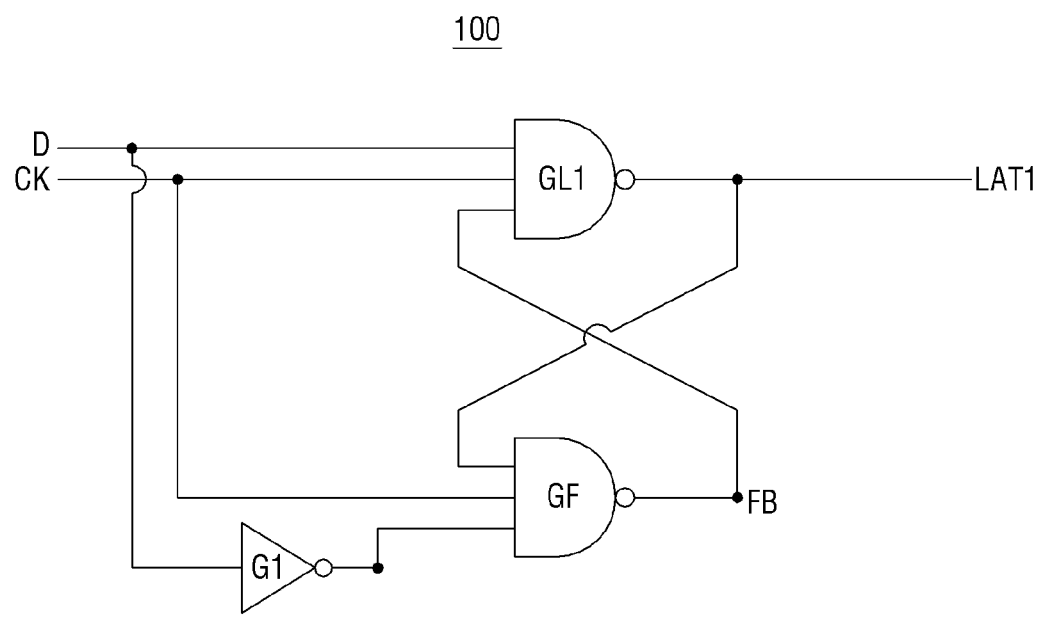
FIG. 1 is a circuit diagram illustrating a semiconductor circuit according to an embodiment of the present disclosure.

Embodiments will be described in detail with reference to the accompanying drawings. The disclosure, however, may be embodied in various different forms, and should not be construed as being limited only to the illustrated embodiments. Rather, these embodiments are provided as examples so that this disclosure will be thorough and complete, and will fully convey the concept of the disclosure to those skilled in the art. Accordingly, known processes, elements, and techniques are not described with respect to some of the embodiments of the disclosure. Unless otherwise noted, like reference numerals denote like elements throughout the attached drawings and written description, and thus descriptions will not be repeated. In the drawings, the sizes and relative sizes of layers and regions may be exaggerated for clarity.

Advantages and features of the present disclosure and methods of accomplishing the same may be understood more readily by reference to the following detailed description of preferred embodiments and the accompanying drawings.

FIG. 1 is a circuit diagram illustrating a semiconductor circuit according to an embodiment of the present disclosure.

Referring to FIG. 1, a semiconductor circuit 100 according to an embodiment of the present disclosure includes a logic gate GL1 and a logic gate GF.

The logic gate GL1 receives inputs of an input signal D, a clock signal CK and a feedback signal FB and performs a first logical operation to output an output signal LAT1.

In the present embodiment, the logic gate GL1 may include a 3 input NAND logic gate. In this case, the first logical operation may be a NAND logical operation. Here, the 3 input NAND logic gate is a logic gate that receives three input signals, outputs the value of logic "0" only when all the three input signals correspond to a value of logic "1", and outputs the value of logic "1" in all other cases.

The logic gate GF receives the output signal LAT1 of the logic gate GL1, the clock signal CK and an inverted output signal of the input signal D and performs the second logical operation to output the feedback signal FB.

In the present embodiment, the logic gate GF may include a 3 input NAND logic gate. In this case, the second logical operation may be a NAND logical operation.

The semiconductor circuit according to various embodiments of the present disclosure described below may also be modified using different logic gates that perform the same operation, depending on the actual achievement purposes. For example, in the present embodiment, as described above, although both the logic gates GL1, GF may be provided as NAND logic gates that perform the NAND logical operation, both the logic gates GL1, GF may also be provided as NOR logic gates that perform the NOR logical operation. In this case, the input signal input to the logic gates GL1, GF or the output signal output from the logic gates GL1, GF may have inverted logical values different from the above-mentioned configuration as required. For example, when provided as the NAND logic gate, if the logic gate GL1 sets (logic "1", logic "0", and logic "1") as inputs and sets logic "0" as an output, when provided as the NOR logic gate, the logic gate GL1 may set (the logic "0", the logic "1" and the logic "0") as inputs and may set the logic "1" as the output.

That is, in some embodiments of the present disclosure, the logic gate GL1 may include the 3 input NOR logic gate. In this case, the first logical operation may be a NOR logical operation. Here, the 3 input NOR logic gate is a logic gate that receives three input signals, outputs the value of the logic "1" only when all the three input signals correspond to the value of the logic "0", and outputs the value of the logic "0" in all other cases. Meanwhile, the logic gate GF may include a 3 input NOR logic gate. In this case, a second logical operation may be a NOR logical operation.

Such a replacement relation is applicable to all the various embodiments of the disclosure described below, the AND logical operation may be replaced by an OR logical operation, the OR logical operation may be replaced by an AND logical operation, the NAND logical operation may be replaced by a NOR logical operation, and the NOR logical operation may be replaced by a NAND logical operation. That is, although the various circuits described below are mainly expressed by the NAND logic gate, it is obvious to those skilled in the art of the semiconductor circuit that the NOR logic gate having the same function may be used depending on the achievement method. In this case, the values of the input signals input to the logic gates for performing each of the logical operations and the output signals output from the logic gates may be changed to inverted logical values as required.

Meanwhile, hereinafter, the value of the logic "1" will be expressed by "H", and the value of the logic "0" will be expressed by "L".

Meanwhile, in some embodiments of the present disclosure, the semiconductor circuit 100 may further include an inverter G1. The inverter G1 receives the input of the input signal D and performs an inversion logical operation to output the inverted signal of the input signal D. The inverted signal becomes an input signal of the logic gate GF.

Figure 2:
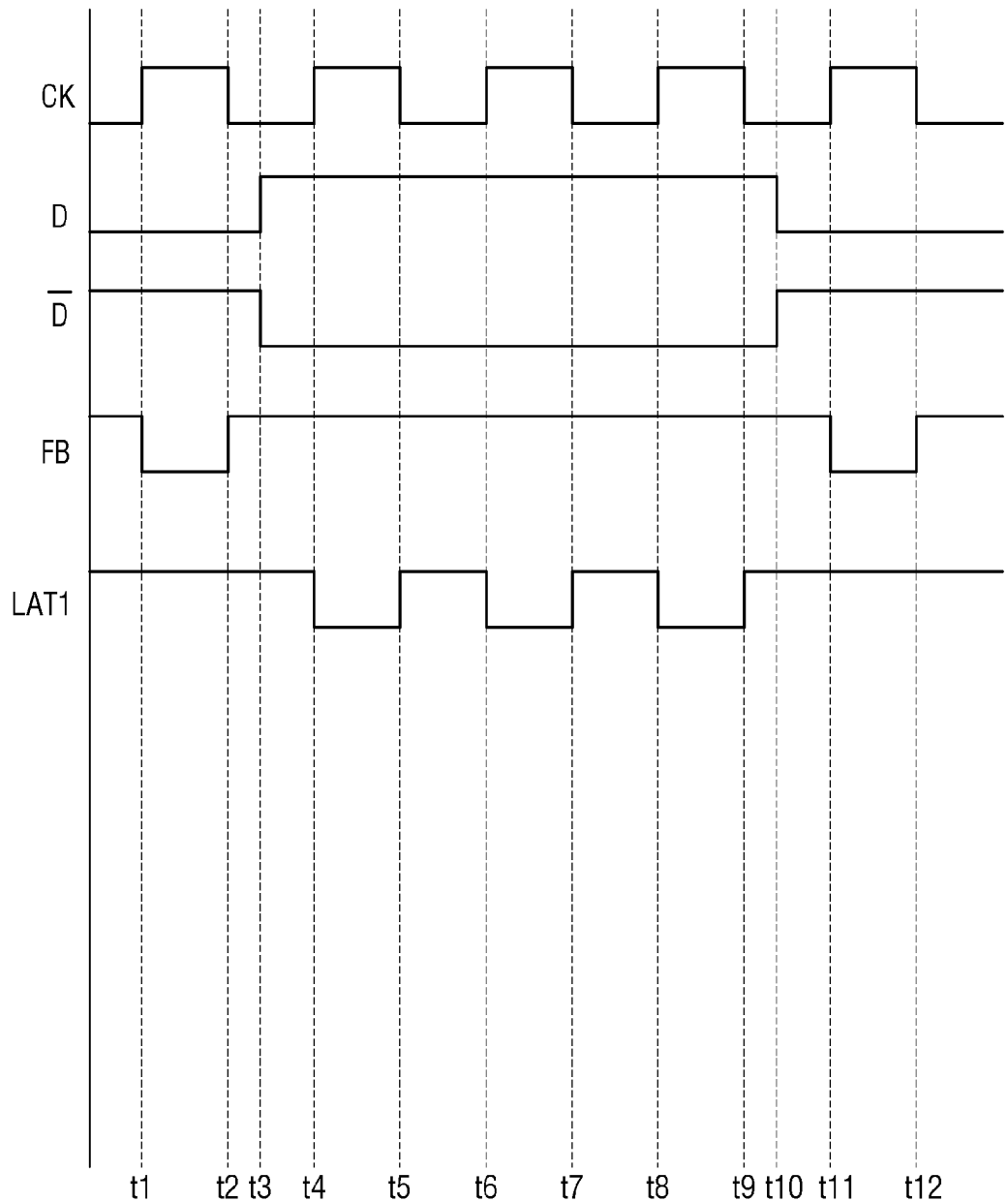
FIG. 2 is a timing chart for explaining an operation of the semiconductor circuit of FIG. 1.

FIG. 2 is a timing chart for explaining the operation of the semiconductor circuit of FIG. 1.

The operation of the semiconductor circuit 100 of FIG. 1 will be described with reference to FIG. 2.

In time sections t1 to t3 and t10 to t12, the value of the input signal D is L. In this case, since the value of one input signal of the three input signals of the logic gate GL1 is L, the value of the output signal LAT1 of the logic gate GL1 becomes H in accordance with the result of the NAND logical operation. In particular, since the value L of the input signal D is always input to the logic gate GL1, the value of the output signal LAT1 is constant H, irrespective of the value of the clock signal CK.

Meanwhile, in this case, because the inverted signal of the input signal D and the output signal LAT1 of the logic gate GL1 among the three input signals of the logic gate GF are H, the feedback signal FB which is an output signal of the logic gate GF has a value of the inverted signal of the clock signal CK in accordance with the result of the NAND logical operations. That is, when the clock signal CK is L, the feedback signal FB is H, and when the clock signal CK is H, the feedback signal FB is L.

In the time sections t3 to t10, the value of the input signal D is H.

First, when examining a case where the clock signal CK is L, because the value of one input signal among the three input signals of the logic gate GL1 is L, i.e., the value of the clock signal CK is L, the value of the output signal LAT1 of the logic gate GL1 becomes H in accordance with the result of the NAND logical operation.

Meanwhile, in this case, because the value of one input signal among the three input signals of the logic gate GF is L, i.e., the value of the inverted signal of the input signal D is L, the value of the feedback signal FB that is the output signal of the logic gate GF also becomes H in accordance with the result of the NAND logical operation. In particular, since the value L of the inverted signal of the input signal D is always input to the logic gate GF, the value of the feedback signal FB is constant H, irrespective of the value of the clock signal CK.

When examining the logic gate GL1 again, because both of the value of the input signal D and the value of the feedback signal FB are H, the output signal LAT1 of the logic gate GL1 has a value of the inverted signal of the clock signal CK in accordance with the result of the NAND logical operation. That is, when the clock signal CK is L, the output signal LAT1 is H, and when the clock signal CK is H, the output signal LAT1 is L.

Such a semiconductor circuit 100 may be applied as a clock gating circuit that selectively outputs the clock signal CK, depending on the value of the input signal D.

Figure 3:
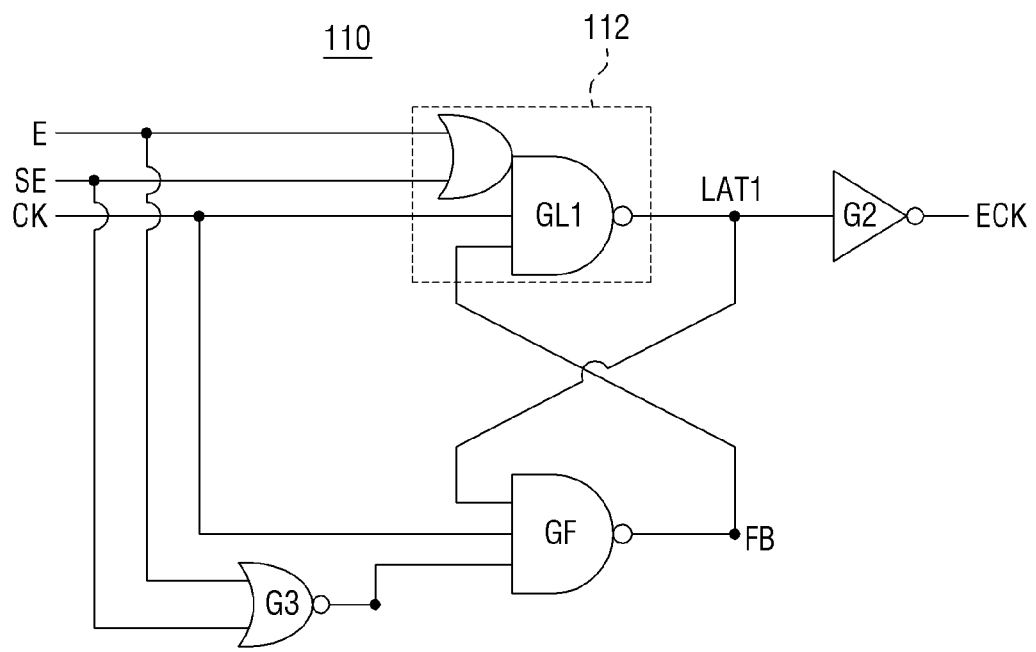
FIG. 3 is a circuit diagram illustrating a semiconductor circuit according to another embodiment of the present disclosure.

FIG. 3 is a circuit diagram illustrating a semiconductor circuit according to another embodiment of the present disclosure.

Referring to FIG. 3, a semiconductor circuit 110 according to another embodiment of the present disclosure differs from the semiconductor circuit 100 of FIG. 1 in that the former has an enable signal E and a scan-enable signal SE as input signals.

There is still another difference in that the logic gate GL1 of FIG. 1 is replaced by a composite logic gate 112 that receives the inputs of an enable signal E, a scan-enable signal SE, a clock signal CK and a feedback signal FB to perform a first sub-logical operation and a second sub-logical operation. Specifically, the composite logic gate 112 may perform a first sub-logical operation on the enable signal E and the scan-enable signal SE to generate a first intermediate signal, and may perform a second sub-logical operation on the first intermediate signal, the clock signal CK and the feedback signal FB to output the first output signal LAT1. In the present embodiment, each of the first sub-logical operation and the second sub-logical operation may be an OR logical operation and a NAND logical operation. Thus, the composite logic gate 112 may be an OR-NAND composite logic gate.

Further, there is another difference in that the semiconductor circuit 110 includes a logic gate G3 which receives the inputs of the enable signal E and the scan-enable signal SE to perform the NOR logical operation, instead of the inverter G1 of FIG. 1.

There is still another difference in that the semiconductor circuit 110 further includes an inverter G2 that receives the input of the output signal LAT1 and performs the inversion logical operation to output the output signal ECK.

Thus, the semiconductor circuit 110 may operate as a high-speed clock gating circuit that receives the enable signal E and the scan-enable signal SE as the input.

Meanwhile, in some other embodiments of the present disclosure, the composite logic gate 112 may also be provided as an AND-NOR composite logic gate that performs each of the AND logical operation and the NOR logical operation as the first sub-logical operation and the second sub-logical operation. In this case, each of the logic gate GF and the logic gate G3 may be provided as each of the 3 input NOR logic gate and the NAND logic gate to perform the same operation as the semiconductor circuit of the above-described present embodiment.

Figure 4:
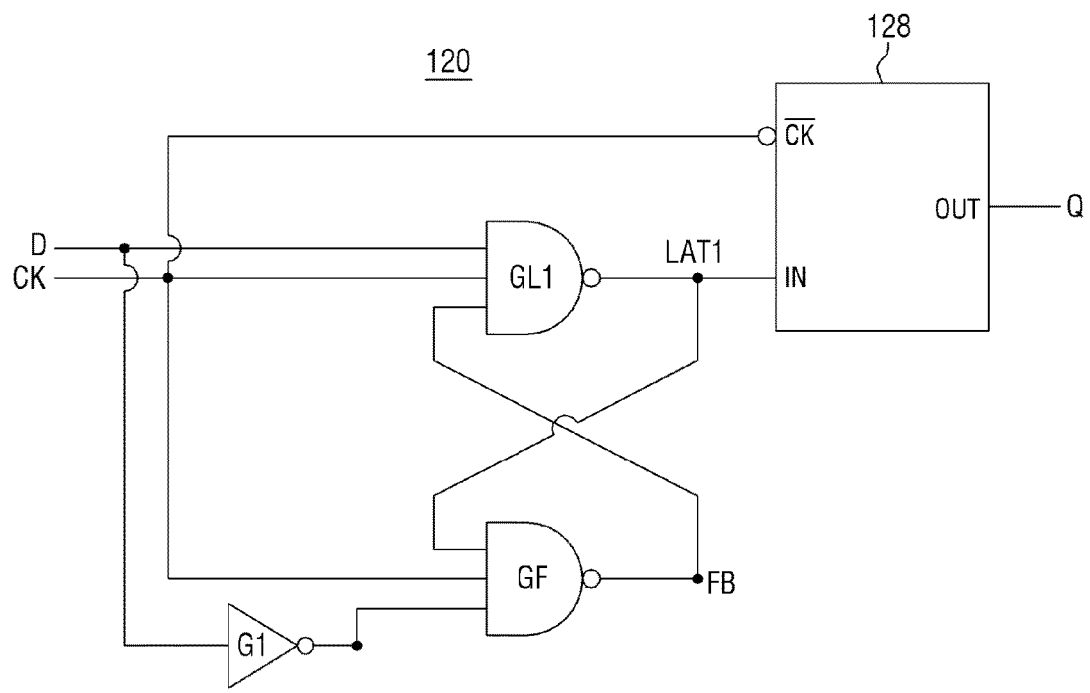
FIG. 4 is a circuit diagram illustrating a semiconductor circuit according to still another embodiment of the present disclosure.

FIG. 4 is a circuit diagram illustrating a semiconductor circuit according to still another embodiment of the present disclosure.

Referring to FIG. 4, a semiconductor circuit 120 according to still another embodiment of the present disclosure differs from the semiconductor circuit 100 of FIG. 1 in that the former further includes a latch 128. The latch 128 receives the output signal LAT1 and the inverted signal of the clock signal CK to output an output signal Q. Although the latch 128 is expressed by a D latch in FIG. 4 for convenience of explanation, the scope of the present disclosure is not limited thereto. In some embodiments of the present disclosure, the latch 128 may be provided as an R-S latch.

Thus, the semiconductor circuit 120 may operate as a flip-flop that propagates the input signal D to the output in a section of the clock signal CK that is H, and stores its value in a section of the clock signal CK that is L.

Figure 5:
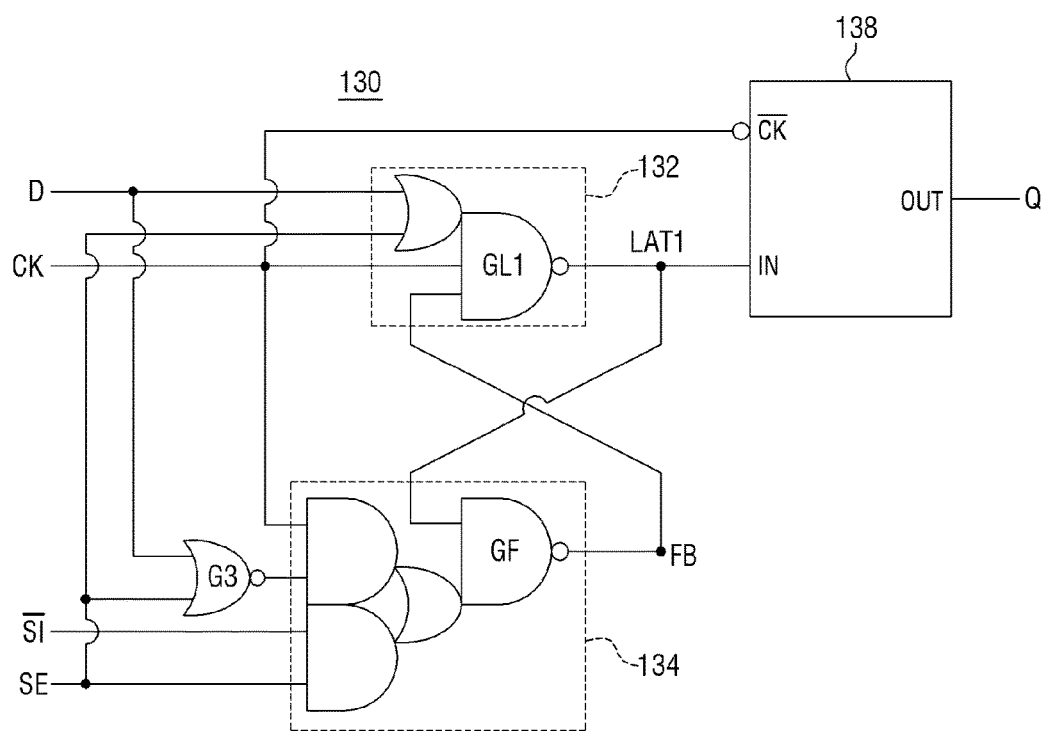
FIG. 5 is a circuit diagram illustrating a semiconductor circuit according to still another embodiment of the present disclosure.

FIG. 5 is a circuit diagram illustrating a semiconductor circuit according to still another embodiment of the present disclosure.

Referring to FIG. 5, a semiconductor circuit 130 according to still another embodiment of the present disclosure differs from the semiconductor circuit 100 of FIG. 1 in that the logic gate GL1 of FIG. 1 is replaced by a composite logic gate 132 that receives the inputs of the input signal D, the scan-enable signal SE, the clock signal CK and the feedback signal FB to perform the first sub-logical operation and the second sub-logical operation. Specifically, the composite logic gate 132 may perform the first sub-logical operation on the input signal D and the scan-enable signal SE to generate a first intermediate signal, and may perform the second sub-logical operation on the first intermediate signal, the clock signal CK and the feedback signal FB to output the first output signal LAT1. In the present embodiment, each of the first sub-logical operation and the second sub-logical operation may be an OR logical operation and a NAND logical operation. Thus, the composite logic gate 132 may be an OR-NAND composite logic gate.

There is another difference in that the semiconductor circuit 130 further includes a logic gate G3 that receives the inputs of the input signal D and the scan-enable signal SE to perform the NOR logical operation, instead of the inverter G1 of FIG. 1.

There is still another difference in that the logic gate GF of FIG. 1 is replaced by a composite logic gate 134 that receives the inputs of the output signal of the logic gate G3, the clock signal CK, the scan-enable signal SE, the inverse of a scan input signal SI and the output signal LAT1 to perform a third sub-logical operation, a fourth sub-logical operation, a fifth sub-logical operation and a sixth sub-logical operation. Specifically, the composite logic gate 134 performs the third sub-logical operation on the clock signal CK and the output signal of the NOR logic gate G3 to generate a second intermediate signal, performs the fourth sub-logical operation on the scan-enable signal SE and the inverted signal of the scan input signal SI to generate a third intermediate signal, performs the fifth sub-logical operation on the second intermediate signal and the third intermediate signal to generate a fourth intermediate signal, and performs the sixth sub-logical operation on the first output signal LAT1 and the fourth intermediate signal to output the feedback signal FB. In the present embodiment, each of the third sub-logical operation through the sixth sub-logical operation may be the AND logical operation, the AND logical operation, the OR logical operation and the NAND logical operation. Thus, the composite logic gate 134 may be a 2AND-OR-NAND composite logic gate.

There is a still another difference in that the semiconductor circuit 130 further includes a latch 138. The latch 138 receives the output signal LAT1 and the inverted signal of the clock signal CK to output an output signal Q. In FIG. 5, although the latch 138 is expressed by a D latch for convenience of explanation, the scope of the present disclosure is not limited thereto. In some embodiments of the present disclosure, the latch 138 may be provided as an R-S latch.

Thus, the semiconductor circuit 130 may operate as a multiplexer type scan flip-flop that uses the scan-enable signal SE as a selection signal. For example, when the scan-enable signal SE is L, the value of the input signal D is stored in the flip-flop, and when the scan-enable signal SE is H, the scan input signal SI is stored in the flip-flop. It is particularly noted that a relatively simple composite logic gate 132 is disposed on a path of the input signal D, and a relatively complicated composite logic gate 134 is disposed on a path of the scan input signal SI.

Meanwhile, in some other embodiments of the present disclosure, the composite logic gate 132 may be provided as an AND-NOR composite logic gate that performs each of the AND logical operation and the NOR logical operation as the first sub-logical operation and the second sub-logical operation, and the composite logic gate 134 may be provided as a 2OR-AND-NOR composite logic gate that performs each of the OR logical operation, the OR logical operation, the AND logical operation and the NOR logical operation as the third the sub-logical operation through the sixth sub-logical operation. In this case, the gate G3 is provided as the NAND logic gate and may perform the same operation as the semiconductor circuit of the above-described present embodiment.

Figure 6:
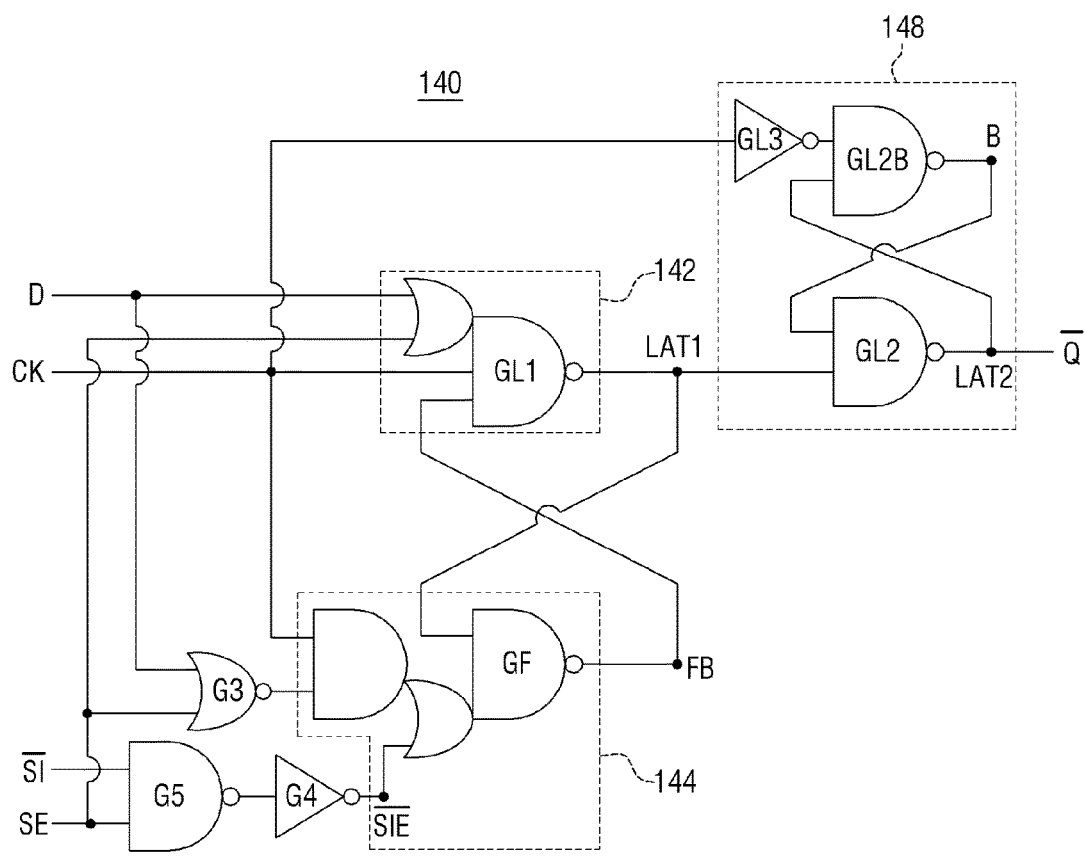
FIG. 6 is a circuit diagram illustrating a semiconductor circuit according to still another embodiment of the present disclosure.

FIG. 6 is a circuit diagram illustrating a semiconductor circuit according to still another embodiment of the present disclosure.

Referring to FIG. 6, a semiconductor circuit 140 according to still another embodiment differs from the semiconductor circuit 130 of FIG. 5 in that the composite logic gate 134 of FIG. 5 is replaced by a composite logic gate 144 that receives the inputs of the output signal of the NOR logic gate G3, the clock signal CK, an inversion of a scan input-enable signal SIE and the output signal LAT1 to perform the third sub-logical operation, the fourth sub-logical operation and the fifth sub-logical operation. Specifically, the composite logic gate 144 performs the third sub-logical operation on the clock signal CK and the output signal of the NOR logic gate G3 to generate a second intermediate signal, performs the fourth sub-logical operation on the second intermediate signal and the inverted signal of the scan input-enable signal SIE to generate a third intermediate signal, and performs the fifth sub-logical operation on the output signal LAT1 and the third intermediate signal to output the feedback signal FB. In the present embodiment, the third sub-logical operation through the fifth sub-logical operation may be each of the AND logical operation, the OR logical operation and the NAND logical operation. Thus, the composite logic gate 144 may be an AND-OR-NAND composite logic gate.

Here, the scan input-enable signal SIE may be generated by sequentially performing a NAND logical operation and an inverse logical operation on the scan-enable signal SE and the inverted signal of the scan input signal SI, using the logic gates G5 and G4.

There is another difference in that the semiconductor circuit 140 includes a circuit 148 that includes a logic gate GL2B for performing the NAND logical operation on the inverse of the clock signal CK, which is inverted by inverter gate GL3, and the output signal LAT2, and a logic gate GL2 for performing the NAND logical operation on the output signal B of the logic gate GL2B and the output signal LAT1, in place of the latch 138 of FIG. 5, to produce an inverse of output signal Q.

Thus, the semiconductor circuit 140 may operate as a multiplexer type scan flip-flop that uses the scan-enable signal SE as a selection signal.

Meanwhile, in some other embodiments of the present disclosure, the composite logic gate 142 may be provided as an AND-NOR composite logic gate that performs each of the AND logical operation and the NOR logical operations as the first sub-logical operation and the second sub-logical operation, and the composite logic gate 144 may be provided as an OR-AND-NOR composite logic gate that performs each of the OR logical operation, the AND logical operation and the NOR logical operation as the third sub-logical operations through fifth sub-logical operations. In this case, each of the gate G3 and the gate G5 may be provided as the NAND logic gate and the NOR logic gate to perform the same operation as the semiconductor circuit of the above-described present embodiment.

Figure 7:
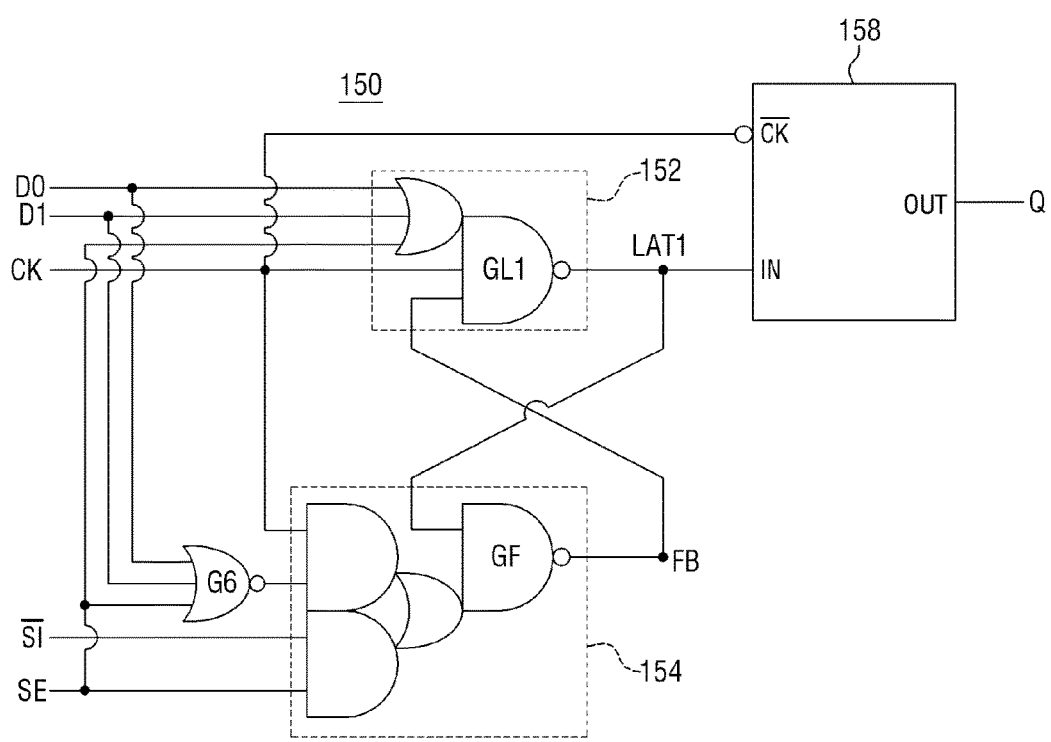
FIG. 7 is a circuit diagram illustrating a semiconductor circuit according to still another embodiment of the present disclosure.

FIG. 7 is a circuit diagram illustrating a semiconductor circuit according to still another embodiment of the present disclosure.

Referring to FIG. 7, a semiconductor circuit 150 according to still another embodiment of the present disclosure differs from the semiconductor circuit 100 of FIG. 1 in that the logic gate GL1 of FIG. 1 is replaced by a composite logic gate 152 that receives the inputs of an input signal D0, an input signal D1, a scan-enable signal SE, a clock signal CK and a feedback signal FB to perform the first sub-logical operation and the second sub-logical operation. Specifically, the composite logic gate 152 performs the first sub-logical operation on the input signal D0, the input signal D1 and the scan-enable signal SE to generate a first intermediate signal, and performs the second sub-logical operation on the first intermediate signal, the clock signal CK and the feedback signal FB to output a first output signal LAT1. In the present embodiment, each of the first sub-logical operation and the second sub-logical operation may be the OR logical operation and the NAND logical operation. Thus, the composite logic gate 152 may be an OR-NAND composite logic gate.

There is another difference in that the semiconductor circuit 150 further includes a logic gate G6 that receives the inputs of the input signal D0, the input signal D1 and the scan-enable signal SE to perform the NOR logical operation, instead of the inverter G1 of FIG. 1. In some embodiments of the present disclosure, the logic gate G6 may be provided as a 3 input NOR logic gate.

There is still another difference in that the logic gate GF of FIG. 1 is replaced by a composite logic gate 154 that receives the inputs of the output signal of the NOR logic gate G6, the clock signal CK, the scan-enable signal SE, the inverted signal of the scan input signal SI and the output signal LAT1 to perform the third sub-logical operation, the fourth sub-logical operation, the fifth sub-logical operation and the sixth sub-logical operation. Specifically, the composite logic gate 154 performs the third sub-logical operation on the clock signal CK and the output signal of the logic gate G6 to generate a second intermediate signal, performs the fourth sub-logical operation on the scan-enable signal SE and the inverted signal of the scan input signal SI to generate a third intermediate signal, performs the fifth sub-logical operation on the second intermediate signal and the third intermediate signal to generate a fourth intermediate signal, and performs the sixth sub-logical operation on the first output signal LAT1 and the fourth intermediate signal to output a feedback signal FB. In the present embodiment, the third sub-logical operation through the sixth sub-logical operation may be each of the AND logical operation, the AND logical operation, the OR logical operation and the NAND logical operation. Thus, the composite logic gate 154 may be a 2AND-OR-NAND composite logic gate.

Thus, the semiconductor circuit 150 may operate as a multiplexer type scan flip-flop that uses the scan-enable signal SE including the OR logic of the input signal D0 and the input signal D1 as the selection signals.

Meanwhile, in some other embodiments of the present disclosure, the composite logic gate 152 may be provided as an AND-NOR composite logic gate that performs each of the AND logical operation and the NOR logical operation as the first sub-logical operation and the second sub-logical operation, and the composite logic gate 134 may be provided as a 2OR-AND-NOR composite logic gate that performs each of the OR logical operation, the OR logical operation, the AND logical operation and the NOR logical operation as the third sub-logical operation through the sixth sub-logical operation. In this case, the gate G3 may be provided as a 3 input NAND logic gate to perform the same operation as the semiconductor circuit of the above-described present embodiment.

Additionally, the semiconductor circuit 150 may include a latch 158 that operates similarly to latch 128 described above in connection with FIG. 4.

Figure 8:
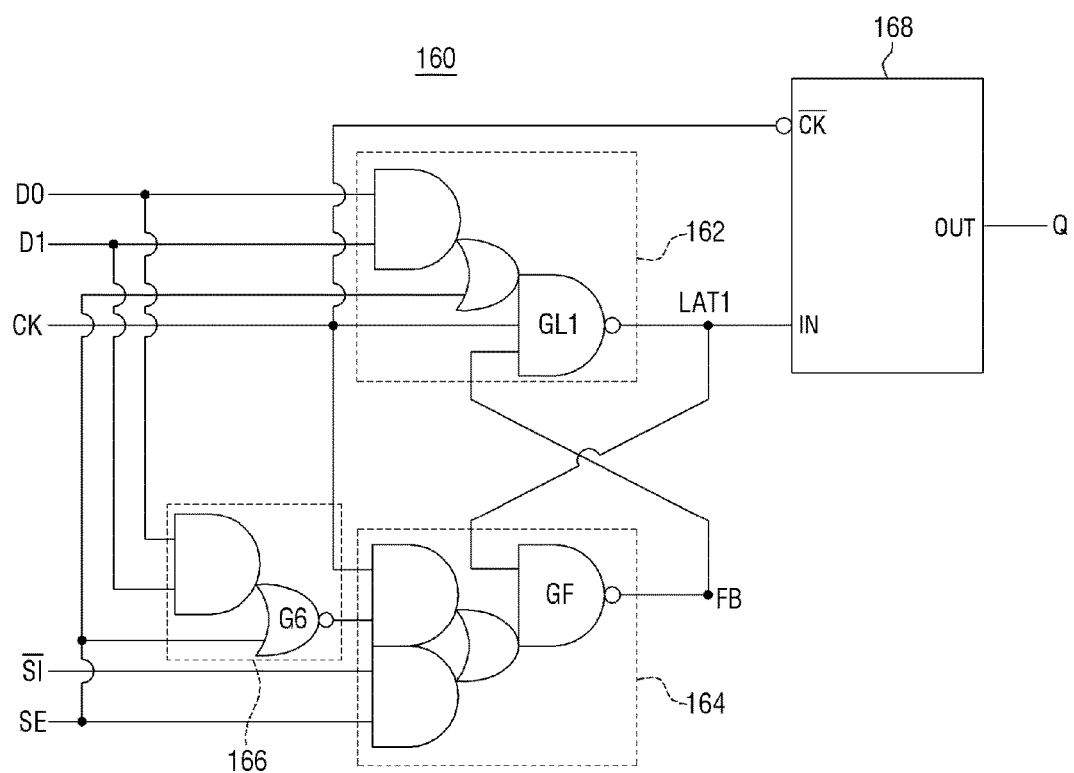
FIG. 8 is a circuit diagram illustrating a semiconductor circuit according to still another embodiment of the present disclosure.

FIG. 8 is a circuit diagram illustrating a semiconductor circuit according to still another embodiment of the present disclosure.

Referring to FIG. 8, a semiconductor circuit 160 according to still another embodiment of the present disclosure differs from the semiconductor circuit 100 of FIG. 1 in that the logic gate GL1 of FIG. 1 is replaced by a composite logic gate 162 that receives the inputs of the input signal D0, the input signal D1, the scan-enable signal SE, the clock signal CK and the feedback signal FB to perform the first sub-logical operation, the second sub-logical operation and the third sub-logical operation. Specifically, the composite logic gate 162 performs the first sub-logical operation on the input signal D0 and the input signal D1 to generate a first intermediate signal, performs the second sub-logical operation on the first intermediate signal and the scan-enable signal SE to generate a second intermediate signal, and performs the third sub-logical operation on the second intermediate signal, the clock signal CK and the feedback signal FB to output a first output signal LAT1. In the present embodiment, each of the first sub-logical operation through the third sub-logical operation may be the AND logical operation, the OR logical operation and the NAND logical operation. Thus, the composite logic gate 162 may be an AND-OR-NAND composite logic gate.

There is another difference in that the semiconductor circuit 160 includes a composite logic gate 166 that receives the inputs of the input signal D0, the input signal D1 and the scan-enable signal SE to perform the fourth sub-logical operation and the fifth sub-logical operation, instead of the inverter G1 of FIG. 1. The composite logic gate 166 performs the fourth sub-logical operation on the input signal D0 and the input signal D1 to generate a third intermediate signal, and performs the fifth sub-logical operation on the third intermediate signal and the scan-enable signal SE. In the present embodiment, each of the fourth sub-logical operation and the fifth sub-logical operations may be the AND logical operation and the NOR logical operation, which is provided by NOR gate G6. Thus, the composite logic gate 166 may be an AND-NOR composite logic gate.

There is still another difference in that the logic gate GF of FIG. 1 is replaced by a composite logic gate 164 that receives the inputs of the output signal of the composite logic gate 166, the clock signal CK, the scan-enable signal SE, the inverted signal of the scan input signal SI and the output signal LAT1 to perform the sixth sub-logical operation, the seventh sub-logical operation, the eighth sub-logical operation and the ninth sub-logical operation. Specifically, the composite logic gate 164 performs the sixth sub-logical operation on the clock signal CK and the output signal of the composite logic gate 166 to generate a fourth intermediate signal, performs the seventh sub-logical operation on the scan-enable signal SE and the inverted signal of the scan input signal SI to generate a fifth intermediate signal, performs the eighth sub-logical operation on the fourth intermediate signal and the fifth intermediate signal to generate a sixth intermediate signal, and performs the ninth sub-logical operation on the first output signal LAT1 and the sixth intermediate signal to output a feedback signal FB. In the present embodiment, each of the sixth sub-logical operation to the ninth sub-logical operation may be the AND logical operation, the AND logical operation, the OR logical operation and the NAND logical operation. Thus, the composite logic gate 164 may be a 2AND-OR-NAND composite logic gate.

Additionally, the semiconductor circuit 160 may include a latch 168 that operates similarly to latch 128 described above in connection with FIG. 4.

Thus, the semiconductor circuit 160 may operate as a multiplexer type scan flip-flop that uses the scan-enable signal SE including the AND logic of the input signal D0 and the input signal D1 as the selection signal.

Meanwhile, in some other embodiments of the present disclosure, the composite logic gate 162 is provided as an OR-AND-NOR composite logic gate that performs each of the OR logical operation, the AND logical operation and the NOR logical operation as the first sub-logical operation through the third sub-logical operation. The composite logic gate 166 is provided as an OR-NAND composite logic gate that performs each of the OR logical operation and the NAND logical operation as the fourth sub-logical operation and the fifth sub-logical operation. The composite logic gate 164 is provided as a 2OR-AND-NOR composite logic gate that performs each of the OR logical operation, the OR logical operation, the AND logical operation and the NOR logical operation as the sixth sub-logical operation through the ninth sub-logical operation. Thus, the semiconductor circuit may perform the same operation as the semiconductor circuit of the above-described present embodiment.

Figure 9:
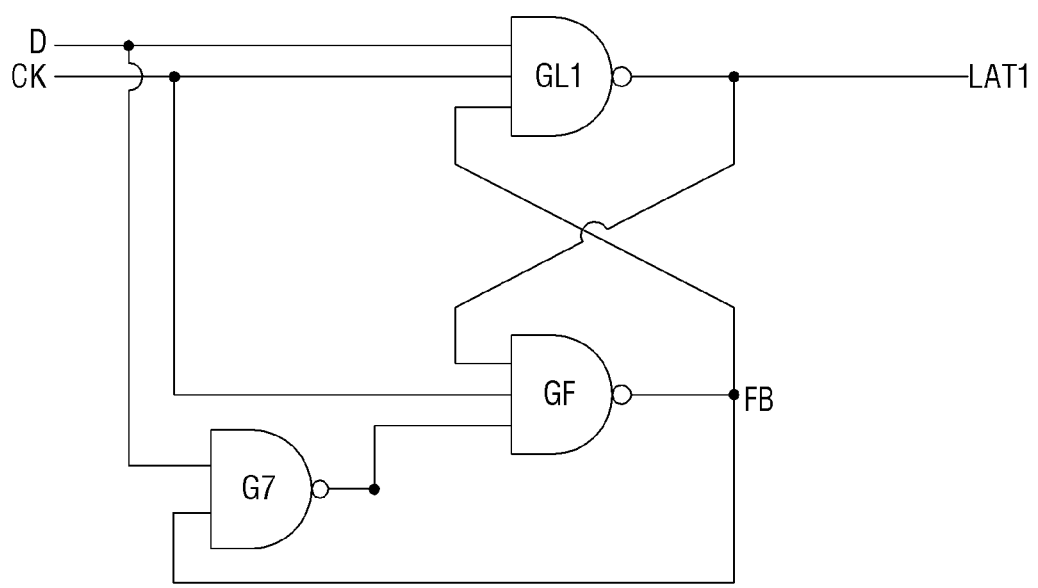
FIG. 9 is a circuit diagram illustrating a semiconductor circuit according to still another embodiment of the present disclosure.

FIG. 9 is a circuit diagram illustrating a semiconductor circuit according to still another embodiment of the present disclosure.

Referring to FIG. 9, a semiconductor circuit 200 according to another embodiment of the present disclosure includes a logic gate GL1, a logic gate G7 and a logic gate GF.

The logic gate GL1 receives the inputs of the input signal D, the clock signal CK and the feedback signal FB and performs the first logical operation to output an output signal LAT1.

In the present embodiment, the logic gate GL1 may include a 3 input NAND logic gate. In this case, the first logical operation may be a NAND logical operation.

The logic gate G7 receives the inputs of the input signal D and the feedback signal FB to perform a second logical operation.

In the present embodiment, the logic gate G7 may include a NAND logic gate. In this case, the second logical operation may be a NAND logical operation.

The logic gate GF receives the inputs of the output signal LAT1 of the logic gate GL1, the clock signal CK and the output of logic gate G7 and performs the third logical operation to output the feedback signal FB.

In the present embodiment, the logic gate GF may include a 3 input NAND logic gate. In this case, the third logical operation may be a NAND logical operation.

As described above in connection with FIG. 1, the semiconductor circuit according to various embodiments of the present disclosure may also be modified using different logic gates that perform the same operation, depending on the actual achievement purposes.

For example, in some other embodiments of the present disclosure, the logic gate GL1 is provided as a 3 input NOR logic gate that performs the NOR logical operation as the first logical operation, and the logic gate G7 is provided as a NOR logic gate that performs the NOR logical operation as the second logical operation, and the logic gate GF is provided as a 3 input NOR logic gate that performs the NOR logical operation as the third logical operation. Thus, the semiconductor circuit may perform the same operation as the semiconductor circuit of the above-described present embodiment.

Figure 10:
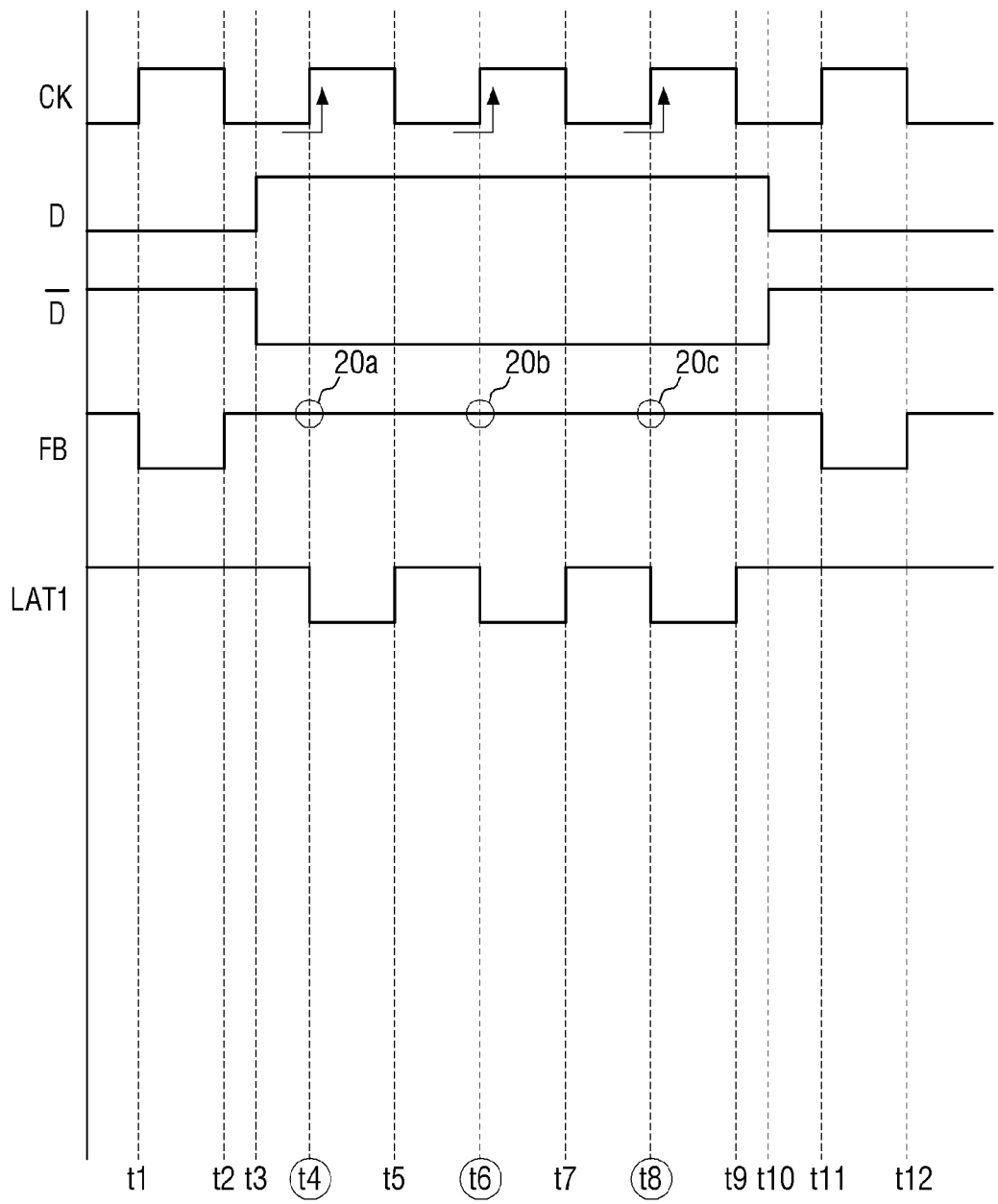
FIG. 10 is a timing chart for explaining the operation of the semiconductor circuit of FIG. 9.

FIG. 10 is a timing chart for explaining the operation of the semiconductor circuit of FIG. 9.

The value of the input signal D is L in the time sections t1 to t3 and t10 to t12.

In this case, since the value of one input signal among the three input signals of the logic gate GL1 is L, the value of the output signal LAT1 of the logic gate GL1 becomes H in accordance with the result of the NAND logical operation. In particular, since the value L of the input signal D is always input to the logic gate GL1, the value of the output signal LAT1 is constant H, irrespective of the value of the clock signal CK.

Meanwhile, the value of the input signal D of the two input signals of the logic gate G7 is L, the output signal of the logic gate G7 is constant H irrespective of the feedback signal FB in accordance with the result of the NAND logical operation.

Next, because both of the output signal of the logic gate G7 and the output signal LAT1 of the logic gate GL1 among the three input signals of the logic gate GF are H, the feedback signal FB that is an output signal of the logic gate GF has a value of the inverted signal of the clock signal CK in accordance with the result of the NAND logical operation. That is, when the clock signal CK is H, the feedback signal FB becomes L, and when the clock signal CK is L, the feedback signal FB becomes H.

In the time sections t3 through t10, the value of the input signal D is a H.

First, when examining the case where the clock signal CK is L, because the value of one input signal among the three input signals of the logic gate GL1 is L, i.e., the value of the clock signal CK is L, the value of the output signal LAT1 of the logic gate GL1 becomes H in accordance with the result of the NAND logical operation.

Meanwhile, because the value of one input signal among the three input signals of the logic gate GF is L, i.e., the value of the clock signal CK is L, the value of the feedback signal FB that is the output signal of the logic gate GF becomes H in accordance with the result of the NAND logical operation.

Next, because the value of the input signal D of the two input signals of the logic gate G7 is H, the output signal of the logic gate G7 has a value of the inverted signal of the feedback signal FB in accordance with the result of the NAND logical operation. When the value of the clock signal CK is L, the output signal of the logic gate G7 is L, because the value of the feedback signal FB is H.

Meanwhile, when examining a case where the clock signal CK is transitioned into H, at the point of time of the transition, among the three input signals of the logic gate GL1, the input signal D and the feedback signal FB are H, and the clock signal CK is transitioned from L into H. Thus, the output signal LAT1 is transitioned from H into L.

At this time, as the output signal LAT1 that is one of three input signals of the logic gate GF is transitioned from H into L, the feedback signal FB is still maintained at H. Further, since the feedback signal FB that is one of the two input signals of the logic gate G7 is maintained at H, the output signal of the logic gate G7 is maintained at L.

Although the operation of the semiconductor circuit 200 according to the present embodiment is substantially the same as that of the semiconductor circuit 100 described in FIG. 1, it is possible to prevent the feedback signal FB from entering the floating states 20a, 20b and 20c at the points of time t4, t6 and t8 at which the input signal D is H and the clock signal CK is transitioned from L into H.

Figure 11:
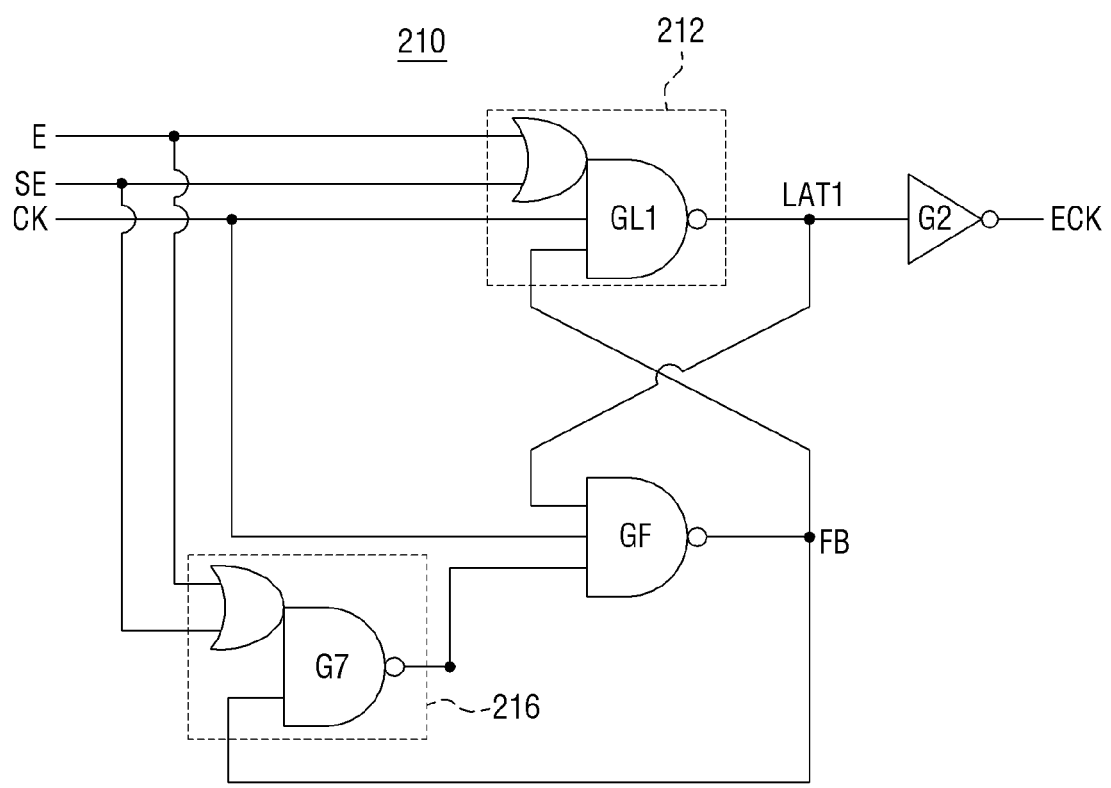
FIG. 11 is a circuit diagram illustrating a semiconductor circuit according to still another embodiment of the present disclosure.

FIG. 11 is a circuit diagram illustrating a semiconductor circuit according to still another embodiment of the present disclosure.

Referring to FIG. 11, a semiconductor circuit 210 according to another embodiment of the present disclosure differs from the semiconductor circuit 200 of FIG. 9 in that the former has the enable signal E and the scan-enable signal SE as the input signals.

There is another difference in that the logic gate GL1 of FIG. 9 is replaced by a composite logic gate 212 that receives the inputs of the enable signal E, the scan-enable signal SE, the clock signal CK and the feedback signal FB to perform the first sub-logical operation and the second sub-logical operation. Specifically, the composite logic gate 212 may perform the first sub-logical operation on the enable signal E and the scan-enable signal SE to generate a first intermediate signal, and may perform the second sub-logical operation on the first intermediate signal, the clock signal CK and the feedback signal FB to output the first output signal LAT1. In the present embodiment, each of the first sub-logical operation and the second sub-logical operation may be the OR logical operation and the NAND logical operation. Thus, the composite logic gate 212 may be an OR-NAND composite logic gate.

There is still another difference in that the semiconductor circuit 210 includes a composite logic gate 216 that receives the inputs of the enable signal E, the scan-enable signal SE and the feedback signal FB to perform the third sub-logical operation and the fourth sub-logical operation, instead of the logic gate G7 of FIG. 9. The composite logic gate 216 performs the third sub-logical operation on the enable signal E and the scan-enable signal SE to generate a second intermediate signal, and performs the fourth sub-logical operation on the second intermediate signal and the feedback signal FB. In the present embodiment, each of the third sub-logical operation and the fourth sub-logical operation may be the OR logical operation and the NAND logical operation. Thus, the composite logic gate 216 may be an OR-NAND composite logic gate.

There is still another difference in that the semiconductor circuit 210 further includes an inverter G2 that receives the input of the output signal LAT1 and performs the inversion logical operation to output the output signal ECK.

Thus, the semiconductor circuit 210 may operate as a high-speed clock gating circuit which receives the inputs of the enable signal E and the scan-enable signal SE.

Meanwhile, in some other embodiments of the present disclosure, the composite logic gate 212 may be provided as an AND-NOR composite logic gate that performs each of the AND logical operation and the NOR logical operation as the first sub-logical operation and the second sub-logical operation, the composite logic gate 216 may be provided as an AND-NOR composite logic gate that performs each of the AND logical operation and the NOR logical operation as the third sub-logical operation and the fourth sub-logical operation. In this case, the logic gate GF may be provided as a 3 input NOR logic gate to perform the same operation as the semiconductor circuit of the above-described present embodiment.

Figure 12:
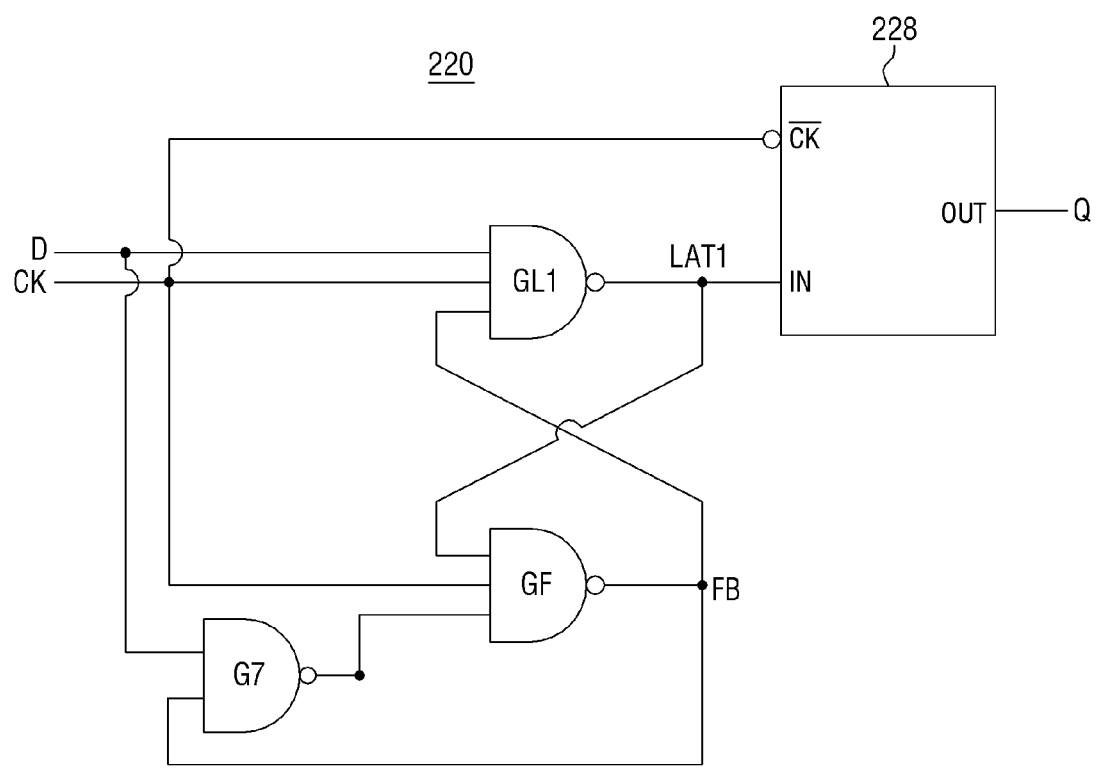
FIG. 12 is a circuit diagram illustrating a semiconductor circuit according to still another embodiment of the present disclosure.

FIG. 12 is a circuit diagram illustrating a semiconductor circuit according to still another embodiment of the present disclosure.

Referring to FIG. 12, a semiconductor circuit 220 according to still another embodiment of the present disclosure differs from the semiconductor circuit 200 of FIG. 9 in that the former further includes a latch 228. The latch 228 receives the output signal LAT1 and the inverted signal of the clock signal CK to output the output signal Q. Although the latch 228 is expressed by a D latch in FIG. 12 for convenience of explanation, the scope of the present disclosure is not limited thereto. In some embodiments of the present disclosure, the latch 228 may be provided as an R-S latch.

Thus, the semiconductor circuit 220 may operate as a flip-flop that propagates the input signal D to the output in a section of the clock signal CK that is H and stores the value in a section of the clock signal CK that is L.

Figure 13:
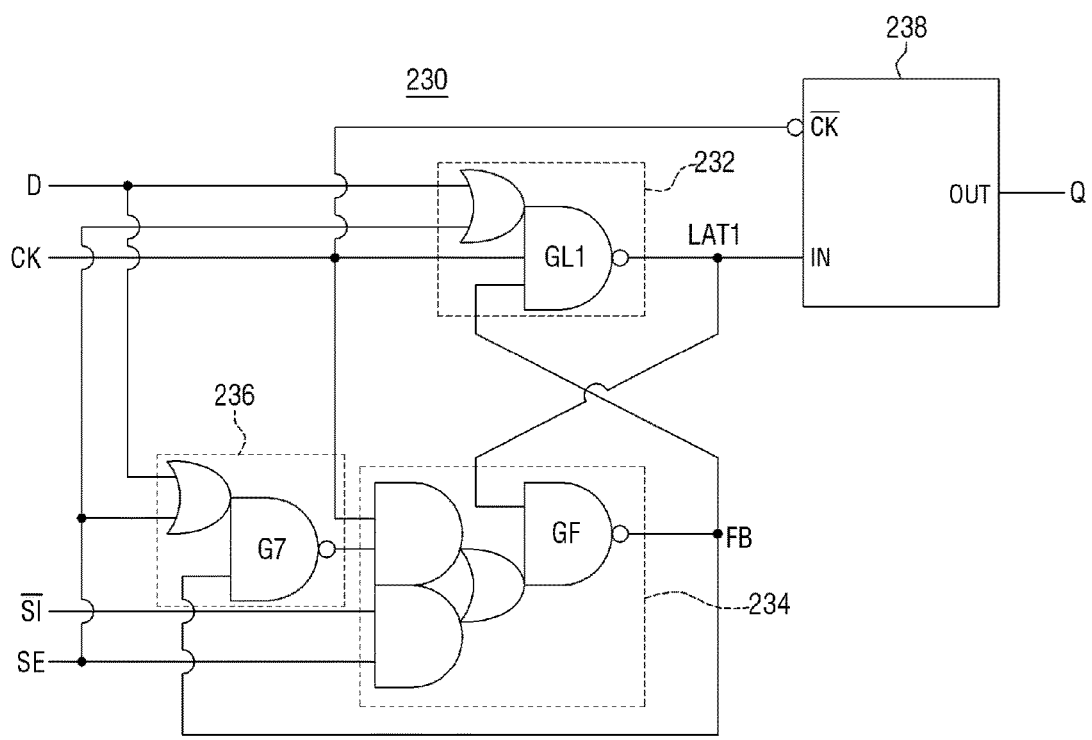
FIG. 13 is a circuit diagram illustrating a semiconductor circuit according to still another embodiment of the present disclosure.

FIG. 13 is a circuit diagram illustrating a semiconductor circuit according to still another embodiment of the present disclosure.

Referring to FIG. 13, a semiconductor circuit 230 according to another embodiment of the present disclosure differs from the semiconductor circuit 200 of FIG. 9 in that the logic gate GL1 of FIG. 9 is replaced by a composite logic gate 232 that receives the inputs of the input signal D, the scan-enable signal SE, the clock signal CK and the feedback signal FB to perform the first sub-logical operation and the second sub-logical operation. Specifically, the composite logic gate 232 may perform the first sub-logical operation on the input signal D and the scan-enable signal SE to generate a first intermediate signal, and may perform the second sub-logical operation on the first intermediate signal, the clock signal CK and the feedback signal FB to output the first output signal LAT1. In the present embodiment, each of the first sub-logical operation and the second sub-logical operation may be the OR logical operation and the NAND logical operation. Thus, the composite logic gate 232 may be an OR-NAND composite logic gate.

There is still another difference in that the semiconductor circuit 230 includes a composite logic gate 236 that receives the inputs of the input signal D, the scan-enable signal SE and the feedback signal FB to perform the third sub-logical operation and the fourth sub-logical operation, instead of the logic gate G7 of FIG. 9. The composite logic gate 236 performs the third sub-logical operation on the input signal D and the scan-enable signal SE to generate a second intermediate signal, and performs the fourth sub-logical operation on the second intermediate signal and the feedback signal FB. In the present embodiment, each of the third sub-logical operation and the fourth sub-logical operation may be the OR logical operation and the NAND logical operation. Thus, the composite logic gate 236 may be an OR-NAND composite logic gate.

There is still another difference in that the logic gate GF of FIG. 9 is replaced by a composite logic gate 234 that receives the inputs of the output signal of the composite logic gate 236, the clock signal CK, the scan-enable signal SE, an inversion of a scan input signal SI and the output signal LAT1 to perform the fifth sub-logical operation, the sixth sub-logical operation, the seventh sub-logical operation and the eighth sub-logical operation. Specifically, the composite logic gate 234 performs the fifth sub-logical operation on the clock signal CK and the output signal of the composite logic gate 236 to generate a third intermediate signal, performs the sixth sub-logical operation on the scan-enable signal SE and the inverted signal of the scan input signal SI to generate a fourth intermediate signal, performs the seventh sub-logical operation on the third intermediate signal and the fourth intermediate signal to generate a fifth intermediate signal, and performs the eighth sub-logical operation on the first output signal LAT1 and the fifth intermediate signal to output a feedback signal FB. In the present embodiment, each of the fifth sub-logical operation through the eighth sub-logical operation may be the AND logical operation, the AND logical operation, the OR logical operation and the NAND logical operation. Thus, the composite logic gate 234 may be a 2AND-OR-NAND composite logic gate.

There is another difference in that the semiconductor circuit 230 further includes a latch 238. The latch 238 receives the inputs of the output signal LAT1 and the inverted signal of the clock signal CK to output an output signal Q. Although the latch 238 is expressed by a D latch in FIG. 13 for convenience of explanation, the scope of the present disclosure is not limited thereto. In some embodiments of the present disclosure, the latch 238 may be provided as an R-S latch.

Thus, the semiconductor circuit 230 may operate as a multiplexer type scan flip-flop that uses the scan-enable signal SE as a selection signal.

Meanwhile, in some other embodiments of the present disclosure, the composite logic gate 232 is provided as an AND-NOR composite logic gate that performs each of AND logical operation and the NOR logical operation as the first sub-logical operation and the second sub-logical operation. The composite logic gate 236 is provided as an AND-NOR composite logic gate that performs each of the AND logical operation and the NOR logical operation as the third sub-logical operation and the fourth sub-logical operation. The composite logic gate 234 is provided as a 2OR-AND-NOR composite logic gate that performs each of the OR logical operation, the OR logical operation, the AND logical operation and the NOR logical operation as the fifth sub-logical operation through the eighth sub-logical operation. Thus, the semiconductor circuit 230 may perform the same operation as the semiconductor circuit of the above-described present embodiment.

Figure 14:
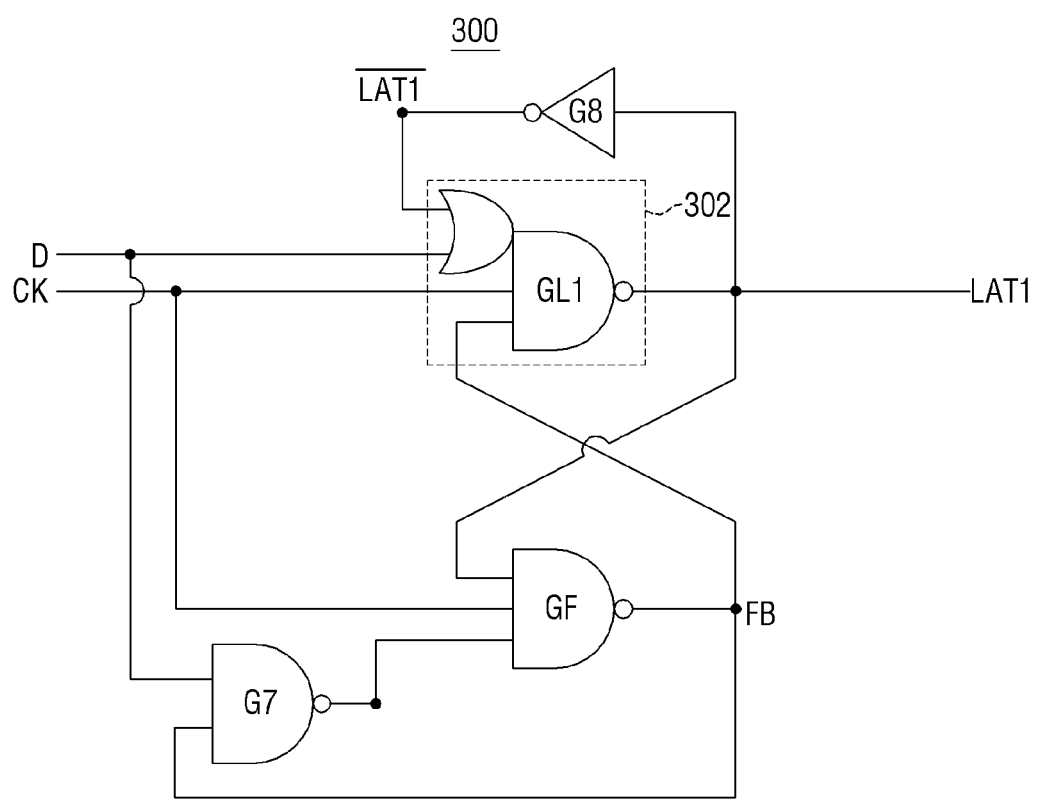
FIG. 14 is a circuit diagram illustrating a semiconductor circuit according to still another embodiment of the present disclosure.

FIG. 14 is a circuit diagram illustrating a semiconductor circuit according to still another embodiment of the present disclosure.

Referring to FIG. 14, a semiconductor circuit 300 according to still another embodiment of the present disclosure includes a logic gate 302, a logic gate G7 and a logic gate GF.

The logic gate 302 includes a composite logic gate that receives the inputs of the inverted signal of the output signal LAT1, the input signal D, the clock signal CK and the feedback signal FB to perform the first sub-logical operation and the second sub-logical operation. Specifically, the logic gate 302 may perform the first sub-logical operation on the inverted signal of the output signal LAT1 and the input signal D to generate an intermediate signal, and may perform the second sub-logical operation on the intermediate signal and the clock signal CK to output an output signal LAT1. To this end, the semiconductor circuit 300 further includes an inverter G8 that receives the input of the output signal LAT1 and performs the inversion logical operation to output an inverted signal of the output signal LAT1. In the present embodiment, each of the first sub-logical operation and the second sub-logical operation may be the OR logical operation and the NAND logical operation. Thus, the logic gate 302 may be an OR-NAND composite logic gate.

The logic gate G7 receives the inputs of the input signal D and the feedback signal FB to perform a first logical operation.

In the present embodiment, the logic gate G7 may include a NAND logic gate. In this case, the first logical operation may be a NAND logical operation.

The logic gate GF receives the inputs of the output signal LAT1 of the logic gate GL1, the clock signal CK and the output signal of the logic gate G7 and performs the second logical operation to output the feedback signal FB.

In the present embodiment, the logic gate GF may include a 3 input NAND logic gate. In this case, the second logical operation may be a NAND logical operation.

As described above in connection with FIG. 1, the semiconductor circuit according to various embodiments of the present disclosure may also be modified using different logic gates that perform the same operation, depending on the actual implementation purposes.

For example, in some other embodiments of the present disclosure, the logic gate GL1 is provided as an AND-NOR composite logic gate that performs each of the AND logical operation and the NOR logical operation as the first sub-logical operation and the second sub-logical operation. The logic gate G7 is provided as a NOR logic gate that performs the NOR logical operation as the first logical operation. The logic gate GF is provided as a 3 input NOR logic gate that performs the NOR logical operation as the second logical operation. Thus, the semiconductor circuit may perform the same operation as the semiconductor circuit of the above-described present embodiment.

Figure 15:
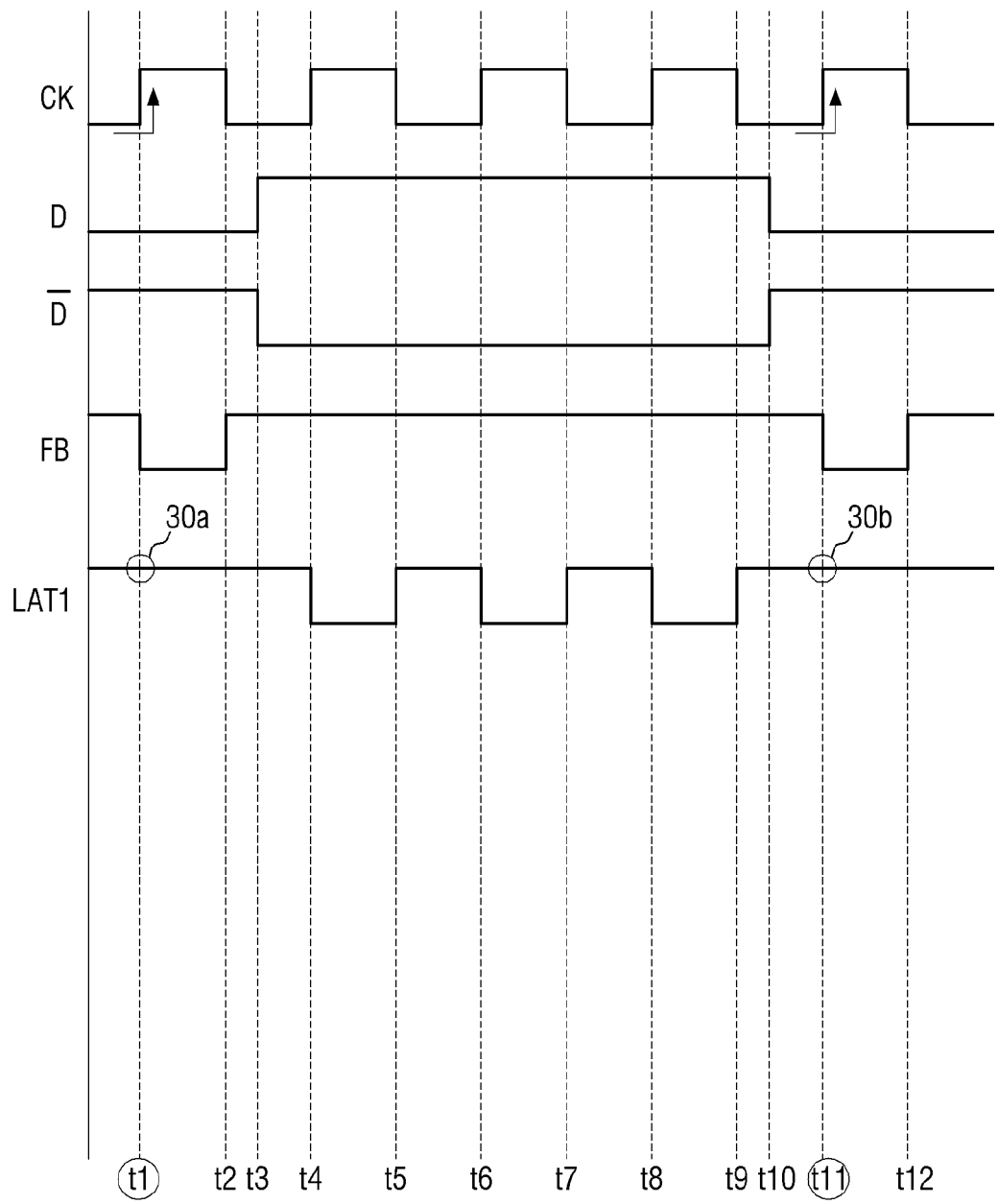
FIG. 15 is a timing chart for explaining the operation of the semiconductor circuit of FIG. 14.

FIG. 15 is a timing chart for explaining the operation of the semiconductor circuit of FIG. 14.

In the time sections t1 to t3 and t10 to t12, the value of the input signal D is L.

First, when examining a case where the clock signal CK is L, since the value of one input signal among the three input signals of the logic gate GL1, i.e., the value of the clock signal CK is L, the value of the output signal LAT1 of the logic gate GL1 becomes H in accordance with the result of the NAND logical operation. Thus, the inverted signal of the output signal LAT1 that is input to the composite logic gate 302 becomes L.

Meanwhile, since the value of one input signal among the three input signals of the logic gate GF is L, i.e., the value of the clock signal CK is L, the value of the feedback signal FB that is an output signal of the logic gate GF becomes H in accordance with the result of the NAND logical operation.

Next, since the value of the input signal D of the two input signals of the logic gate G7 is L, the output signal of the logic gate G7 becomes H in accordance with the result of the NAND logical operation.

Meanwhile, when examining a case where the clock signal CK is transitioned into H, at the point of time of the transition, among the three input signals of the logic gate GF, the output signal LAT1 and the output signal of the logic gate G7 are H, and the clock signal CK is transitioned from L into H. As a result, the feedback signal FB is transitioned from H into L.

At this time, as the feedback signal FB that is one of the three input signals of the composite logic gate 302 is transitioned from H into L, the output signal LAT1 is still maintained at H.

Although the operation of the semiconductor circuit 300 according to the present embodiment is substantially the same as that of the semiconductor circuit 200 described in FIG. 9, it is possible to prevent the output signal LAT1 from entering the floating states 30a and 30b at the points of time t1 and t11 at which the input signal D is L and the clock signal CK is transitioned from L into H.

Figure 16:
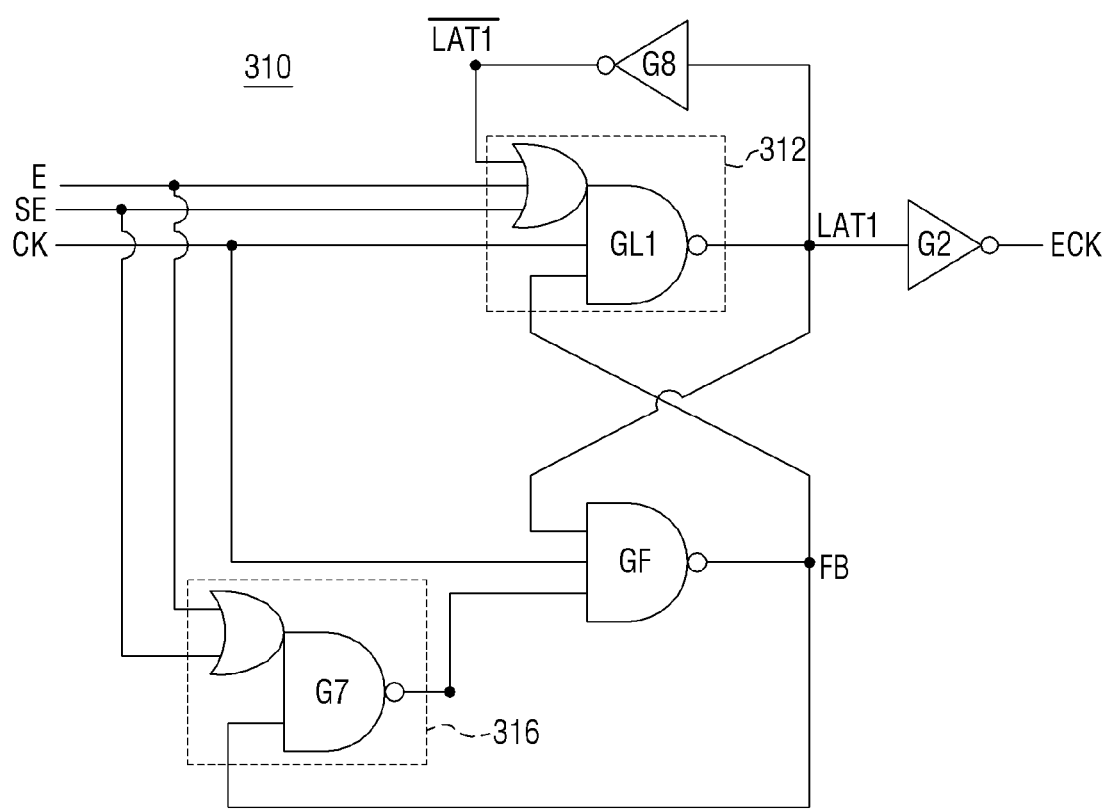
FIG. 16 is a circuit diagram illustrating a semiconductor circuit according to still another embodiment of the present disclosure.

FIG. 16 is a circuit diagram illustrating a semiconductor circuit according to still another embodiment of the present disclosure.

Referring to FIG. 16, a semiconductor circuit 310 according to another embodiment of the present disclosure differs from the semiconductor circuit 300 of FIG. 14 in that the former has an enable signal E and a scan-enable signal SE as the input signals.

There is another difference in that the logic gate 302 of FIG. 14 is replaced by a composite logic gate 312 that receives the inputs of the inverted signal of output signal LAT1, the enable signal E, the scan-enable signal SE, the clock signal CK and the feedback signal FB to perform the third sub-logical operation and the fourth sub-logical operation. Specifically, the composite logic gate 312 may perform the third sub-logical operation on the inverted signal of the output signal LAT1, the enable signal E and the scan-enable signal SE to generate a first intermediate signal, and may perform the fourth sub-logical operation on the first intermediate signal, the clock signal CK and the feedback signal FB to output a first output signal LAT1. In the present embodiment, each of the third sub-logical operation and the fourth sub-logical operation may be the OR logical operation and the NAND logical operation. Thus, the composite logic gate 312 may be an OR-NAND composite logic gate. The inversion of the output signal LAT1 may be performed by an inverter gate G8.

There is another difference in that the semiconductor circuit 310 includes a composite logic gate 316 that receives the inputs of the enable signal E, the scan-enable signal SE and the feedback signal FB to perform the fifth sub-logical operation and the sixth sub-logical operation, instead of the logic gate G7 of FIG. 14. The composite logic gate 316 performs the fifth sub-logical operation on the enable signal E and the scan-enable signal SE to generate a second intermediate signal, and performs the sixth sub-logical operation on the second intermediate signal and the feedback signal FB. In the present embodiment, each of the fifth sub-logical operation and the sixth sub-logical operation may be the OR logical operation and the NAND logical operation. Thus, the composite logic gate 316 may be an OR-NAND composite logic gate.

There is still another difference in that the semiconductor circuit 310 further includes an inverter G2 that receives the output signal LAT1 and performs the inversion logical operation to output an output signal ECK.

Thus, the semiconductor circuit 210 may operate as a high-speed clock gating circuit which receives the enable signal E and the scan-enable signal SE.

Meanwhile, in some other embodiments of the present disclosure, the composite logic gate 312 may be provided as an AND-NOR composite logic gate that performs each of the AND logical operation and the NOR logical operation as the first sub-logical operation and the second sub-logical operation, and the composite logic gate 316 may be provided as an AND-NOR composite logic gate that performs the AND logical operation and the NOR logical operation as the fifth sub-logical operation and the sixth sub-logical operation. In this case, the logic gate GF may be provided as a 3 input NOR logic gate to perform the same operation as the semiconductor circuit of the above-described present embodiment.

Figure 17:
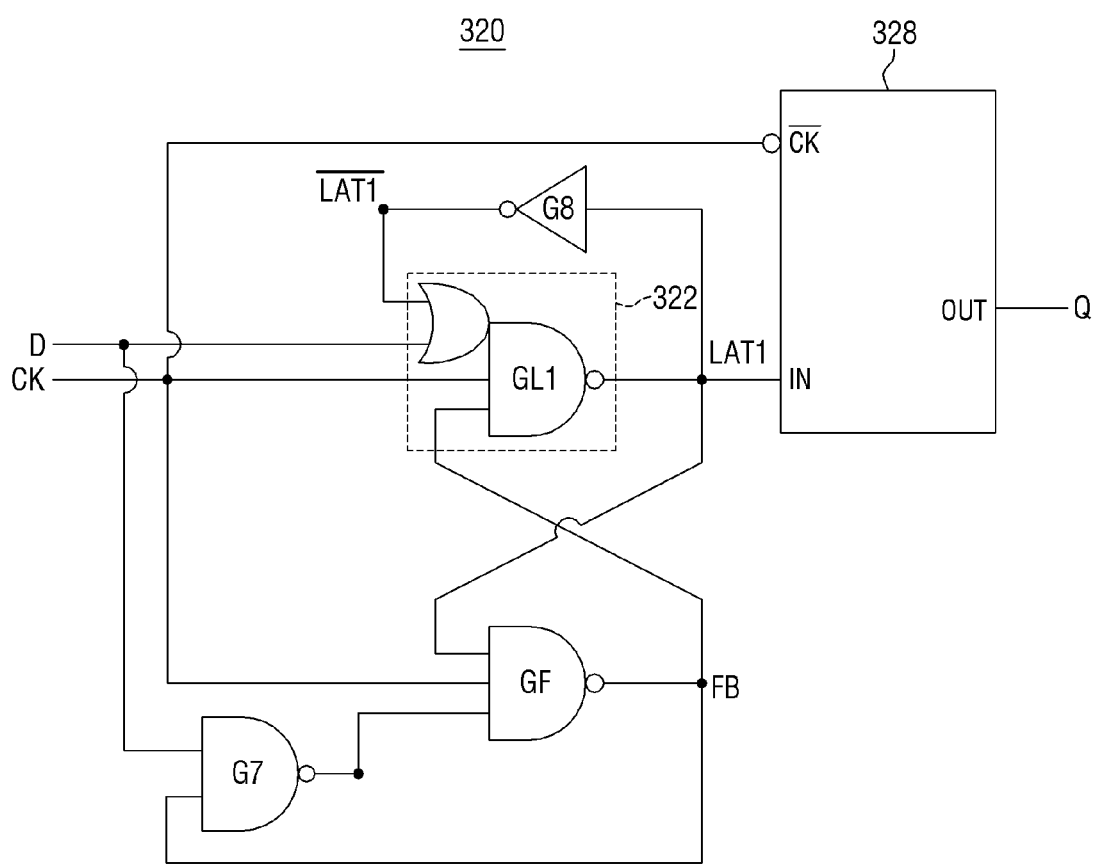
FIG. 17 is a circuit diagram illustrating a semiconductor circuit according to still another embodiment of the present disclosure.

FIG. 17 is a circuit diagram illustrating a semiconductor circuit according to still another embodiment of the present disclosure.

Referring to FIG. 17, a semiconductor circuit 320 according to still another embodiment of the present disclosure differs from the semiconductor circuit 300 of FIG. 14 in that the former further includes a latch 328. The latch 328 receives the inputs of the output signal LAT1 and the inverted signal of the clock signal CK to output an output signal Q. Although the latch 328 is expressed by a D latch in FIG. 17 for convenience of explanation, the scope of the present disclosure is not limited thereto. In some embodiments of the present disclosure, the latch 328 may be provided as an R-S latch.

Thus, the semiconductor circuit 320 may operate as a flip-flop that propagates the input signal D to the output in a section of the clock signal CK that is H, and stores the value in a section of the clock signal CK that is L.

Figure 18:
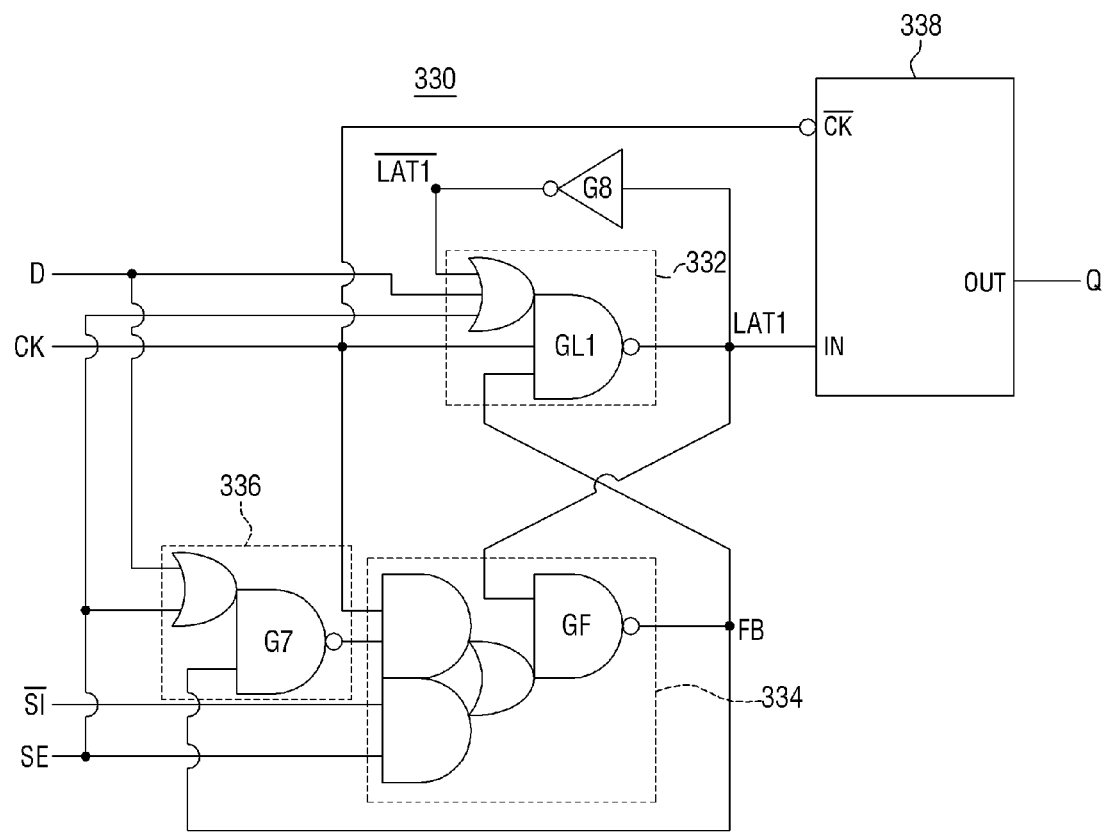
FIG. 18 is a circuit diagram illustrating a semiconductor circuit according to still another embodiment of the present disclosure.

FIG. 18 is a circuit diagram illustrating a semiconductor circuit according to still another embodiment of the present disclosure.

Referring to FIG. 18, a semiconductor circuit 330 according to another embodiment of the present disclosure differs from the semiconductor circuit 300 of FIG. 14 in that the logic gate 302 of FIG. 9 is replaced by a composite logic gate 332 that receives the inputs of the inverted signal of the output signal LAT1, the input signal D, the scan-enable signal SE, the clock signal CK and the feedback signal FB to perform the third sub-logical operation and the fourth sub-logical operation. The composite logic gate 332 may perform the third sub-logical operation on the inverted signal of the output signal LAT1, the input signal D and the scan-enable signal SE to generate a first intermediate signal, and may perform the fourth sub-logical operation on the first intermediate signal, the clock signal CK and the feedback signal FB to output the first output signal LAT1. In the present embodiment, each of the third sub-logical operation and the fourth sub-logical operation may be the OR logical operation and the NAND logical operation. The output signal LAT1 may be inverted by the logic gate G8. Thus, the composite logic gate 332 may be an OR-NAND composite logic gate.

There is another difference in that the semiconductor circuit 330 includes a composite logic gate 336 that receives the inputs of the input signal D, the scan-enable signal SE and the feedback signal FB to perform the fifth sub-logical operation and the sixth sub-logical operation, instead of the logic gate G7 of FIG. 14. The composite logic gate 336 performs the fifth sub-logical operation on the input signal D and the scan-enable signal SE to generate a second intermediate signal, and performs the sixth sub-logical operation on the second intermediate signal and the feedback signal FB. In the present embodiment, each of the fifth sub-logical operation and the sixth sub-logical operation may be the OR logical operation and the NAND logical operation. Thus, the composite logic gate 336 may be an OR-NAND composite logic gate.

There is still another difference in that the logic gate GF of FIG. 14 is replaced by a composite logic gate 334 that receives the inputs of the output signal of the composite logic gate 336, the clock signal CK, the scan-enable signal SE, the inverse of a scan input signal SI and the output signal LAT1 to perform the seventh sub-logical operation, the eighth sub-logical operation, the ninth sub-logical operation and the tenth sub-logical operation. Specifically, the composite logic gate 334 performs the seventh sub-logical operation on the clock signal CK and the output signal of the composite logic gate 336 to generate a third intermediate signal, performs the eighth sub-logical operation on the scan-enable signal SE and the inverted signal of the scan input signal SI to generate a fourth intermediate signal, performs the ninth sub-logical operation on the third intermediate signal and the fourth intermediate signal to generate a fifth intermediate signal, and performs the tenth sub-logical operation on the first output signal LAT1 and the fifth intermediate signal to output a feedback signal FB. In the present embodiment, each of the seventh sub-logical operation through the tenth sub-logical operation may be the AND logical operation, the AND logical operation, the OR logical operation and the NAND logical operation. Thus, the composite logic gate 334 may be a 2AND-OR-NAND composite logic gate.

There is still another difference in that the semiconductor circuit 330 further includes a latch 338. The latch 338 receives the inputs of the output signal LAT1 and an inverted signal of the clock signal CK to output an output signal Q. Although the latch 338 is expressed by a D latch in FIG. 18 for convenience of explanation, the scope of the present disclosure is not limited thereto. In some embodiments of the present disclosure, the latch 338 may be provided as an R-S latch.

Thus, the semiconductor circuit 330 may operate as a multiplexer type scan flip-flop that uses the scan-enable signal SE as a selection signal.

Meanwhile, in some other embodiments of the present disclosure, the composite logic gate 332 is provided as an AND-NOR composite logic gate that performs each of the AND logical operation and the NOR logical operations as the third sub-logical operation and the fourth sub-logical operation. The composite logic gate 336 is provided as an AND-NOR composite logic gate that performs the AND logical operation and the NOR logical operation as the fifth sub-logical operation and the sixth sub-logical operation. The composite logic gate 334 is provided as a 2OR-AND-NOR composite logic gate that performs each of the OR logical operation, the OR logical operation, the AND logical operation and the NOR logical operation as the seventh sub-logical operation through the tenth sub-logical operation. Thus, the semiconductor circuit 230 may perform the same operation as the semiconductor circuit of the above-described present embodiment.

Figure 19:
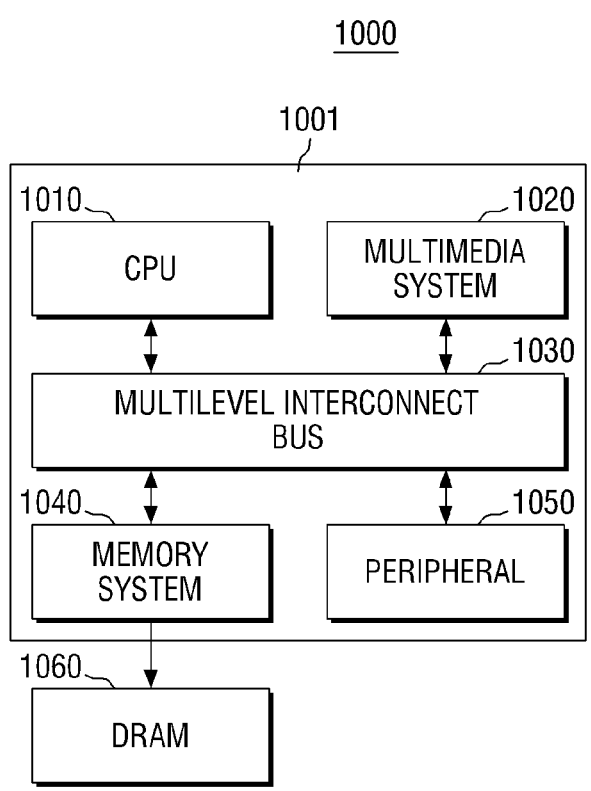
FIG. 19 is a block diagram of an SoC system including the semiconductor circuit according to the embodiments of the present disclosure.

FIG. 19 is a block diagram of an SoC system including the semiconductor circuit according to the embodiments of the present disclosure.

Referring to FIG. 9, the SoC 1000 includes an application processor 1001 and a DRAM 1060.

The application processor 1001 may include a central processing unit 1010, a multimedia system 1020, a bus 1030, a memory system 1040 and a peripheral circuit 1050.

The central processing unit 1010 may perform the operations required for driving the SoC system 1000. In some embodiments of the present disclosure, the central processing unit 1010 may be constituted by a multi-core environment that includes multiple cores.

The multimedia system 1020 may be used to perform various multimedia functions in the SoC system 1000. The multimedia system 1020 may include a 3D engine module, a video codec, a display system, a camera system, a post-processor and the like.

The bus 1030 may be used to perform mutual data communication of the central processing unit 1010, the multimedia system 1020, the memory system 1040 and the peripheral circuit 1050. In some embodiments of the present disclosure, the bus 1030 may have a multilayer structure. Specifically, as an example of the bus 1030, but not limited to, a multilayer advanced high-performance bus (AHB) or a multilayer advanced extensible interface (AXI) may be used.

The memory system 1040 may provide an environment needed for the application processor 1001 to be connected to an external memory (e.g., the DRAM 1060) and operate at high speed. In some embodiments of the present disclosure, the memory system 1040 may include a separate controller (e.g., a DRAM controller) needed to control the external memory (e.g., the DRAM 1060).

The peripheral circuit 1050 may provide an environment needed for the SoC system 1000 to smoothly connect to an external device (e.g., a main board). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In some embodiments of the present disclosure, the DRAM 1060 may be disposed outside the application processor 1001 as illustrated. Specifically, the DRAM 1060 may be packaged with the application processor 1001 in the form of package on package (PoP).

At least one of the constituents of such a SoC 1000 may adopt any one of the semiconductor circuits according to the above-described embodiments of the present disclosure.

Figure 20:
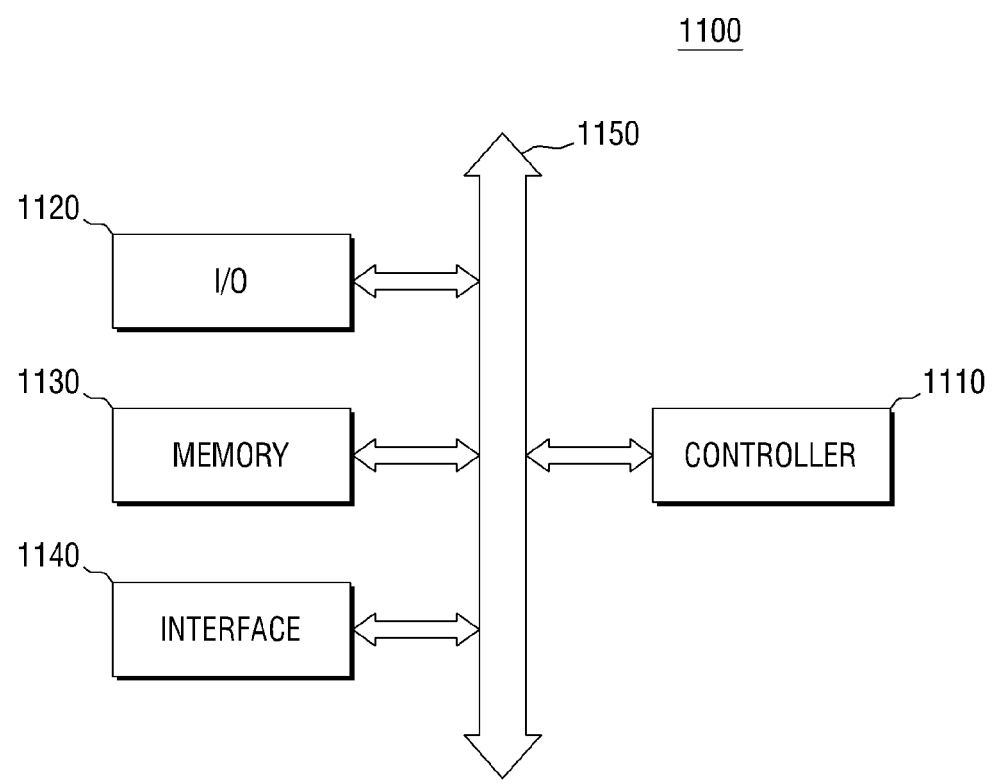
FIG. 20 is a block diagram of an electronic system including the semiconductor circuit according to the embodiments of the present disclosure.

FIG. 20 is a block diagram of an electronic system including the semiconductor circuit according to the embodiments of the present disclosure.

Referring to FIG. 20, an electronic system 1100 including the semiconductor circuit according to the embodiment of the present disclosure may include a controller 1110, an input/output (I/O) device 1120, a memory device 1130, an interface 1140 and a bus 1150. The controller 1110, the I/O device 1120, the memory device 1130 and/or the interface 1140 may be coupled to one another through the bus 1150. The bus 1150 corresponds to a path through which the data are moved.

The controller 1110 may include at least one of a microprocessor, a digital signal processor, a microcontroller and logic devices capable of performing functions similar to these devices. The I/O device 1120 may include a keypad, a keyboard, a display device and the like. The memory device 1130 may store data and/or commands. The interface 1140 may serve to transmit data to or receive data from a communication network. The interface 1140 may be a wired or wireless interface. For example, the interface 1140 may include an antenna or a wired or wireless transceiver.

Although it is not illustrated, the electronic system 1100 may also include a high-speed DRAM or SRAM, as an operating memory for improving the operation of the controller 1110.

The electronic system 1100 may be applied to a personal digital assistant (PDA), a portable computer, a web tablet, a wireless phone, a mobile phone, a digital music player, a memory card or all types of electronic products capable of transmitting or receiving information in a wireless environment.

At least one of the constituents of the electronic system 1100 may adopt any one of the semiconductor circuits according to the above-described embodiments of the present disclosure.

Figure 21:
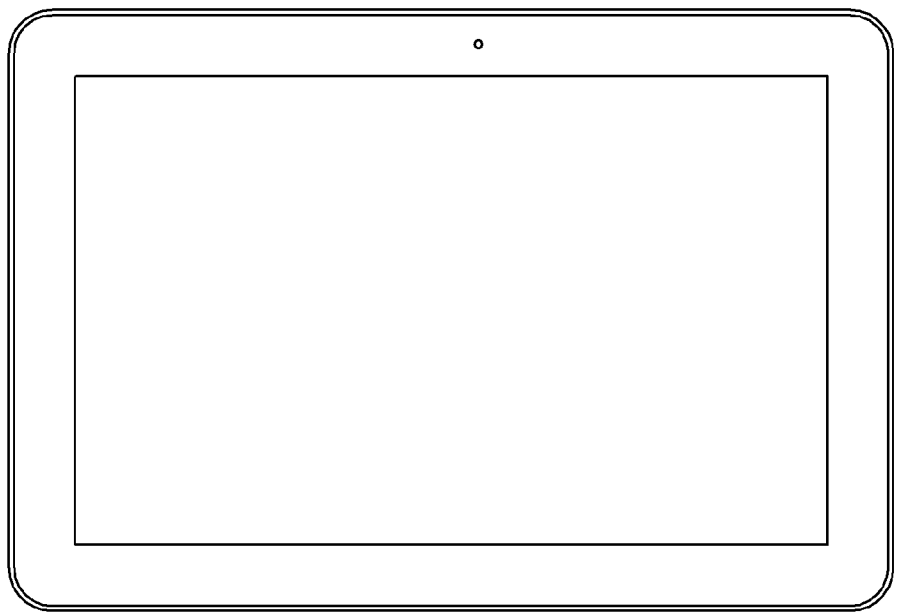
FIGS. 21 to 23 are exemplary semiconductor systems to which the semiconductor circuits according to some embodiments of the present disclosure are applicable.
Figure 22:
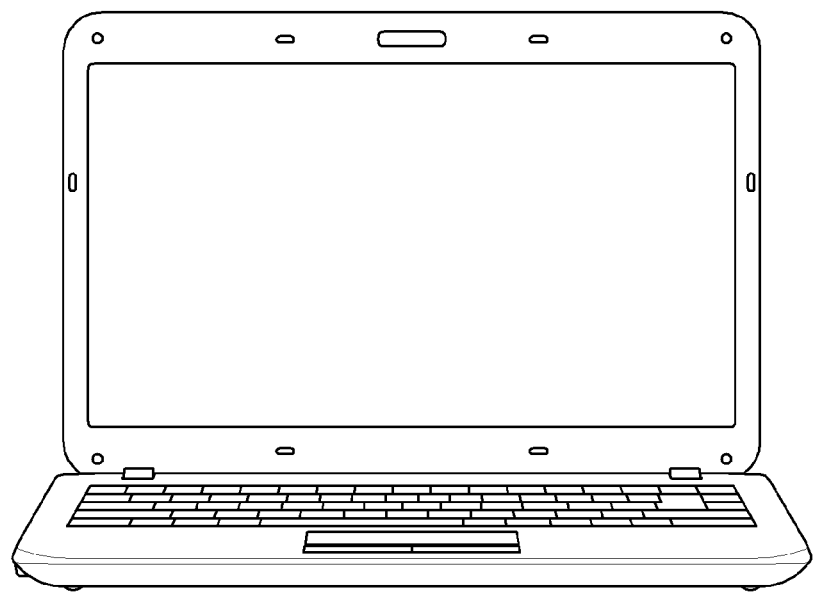
Figure 23:
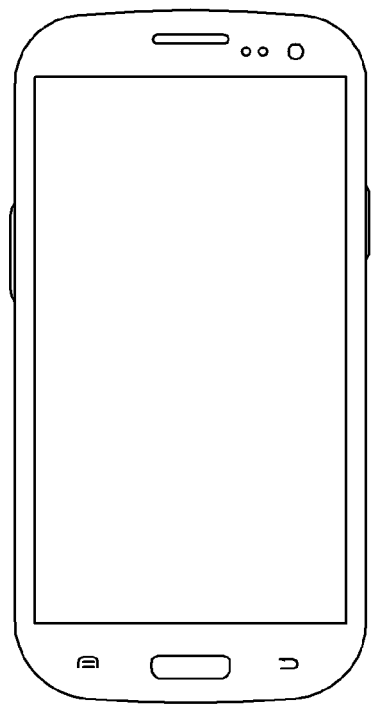

FIGS. 21 through 23 are diagrams illustrating examples of a semiconductor system to which the semiconductor circuits according to some embodiments of the present disclosure can be applied.

FIG. 21 illustrates a tablet personal computer (PC) 1200, FIG. 22 illustrates a notebook computer 1300, and FIG. 23 illustrates a smart phone 1400. At least one of the semiconductor circuits according to the embodiments of the present disclosure may be used in the tablet PC 1200, the notebook computer 1300, the smart phone 1400 and the like.

Further, it is obvious to a person skilled in the art that the semiconductor circuits according to some embodiments of the present disclosure may also be applied to other IC devices other than those set forth herein. That is, while only the tablet PC 1200, the notebook computer 1300 and the smart phone 1400 have been described above as examples of the semiconductor system according to this embodiment, the examples of the semiconductor system according to the present embodiment are not limited thereto. In some embodiments of the present disclosure, the semiconductor system may be provided as a computer, an Ultra Mobile PC (UMPC), a work station, a net-book computer, a personal digital assistant (PDA), a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A semiconductor circuit comprising:
a first logic gate that receives inputs of a first input signal, a clock signal and a feedback signal and performs a first logical operation to output a first output signal;
a second logic gate that receives inputs of the first output signal of the first logic gate, the clock signal, and an inverted output signal of the first input signal and performs a second logical operation to output the feedback signal; and
a third logic gate that receives inputs of a second input signal and a scan-enable signal and performs a third logical operation on the second input signal and the scan-enable signal to generate the first input signal.

2. The semiconductor circuit of claim 1, further comprising an inverter that receives an input of the first input signal and performs an inversion logical operation to output the inverted output signal.

3. The semiconductor circuit of claim 1, wherein:
the first logic gate comprises at least one of a 3 input NAND logic gate, an OR-NAND composite logic gate and an AND-OR-NAND composite logic gate, and
the second logic gate comprises at least one of a 3 input NAND logic gate, a 2AND-OR-NAND composite logic gate and an AND-OR-NAND composite logic gate.

4. The semiconductor circuit of claim 1, wherein:
the first logic gate comprises at least one of a 3 input NOR logic gate, an AND-NOR composite logic gate and an OR-AND-NOR composite logic gate, and
the second logic gate comprises at least one of a 3 input NOR logic gate, a 2OR-AND-NOR composite logic gate and an OR-AND-NOR composite logic gate.

5. The semiconductor circuit of claim 1, wherein the second input signal is an enable signal.

6. The semiconductor circuit of claim 1, further comprising an inverter that receives an input of the first output signal and performs an inversion logical operation to output a second output signal.

7. The semiconductor circuit of claim 1, further comprising a latch that receives inputs of the first output signal and an inverted signal of the clock signal to output a second output signal.

8. The semiconductor circuit of claim 1, wherein the third logic gate also receives a third input signal and performs the third logical operation on the second input signal, the third input signal, and the scan-enable signal to produce the first input signal.

9. The semiconductor circuit of claim 1, wherein the third logic gate comprises a composite logic gate that performs a first sub-logical operation on the second input signal and a third input signal to generate a first intermediate signal and performs a second sub-logical operation on the first intermediate signal and the scan-enable signal to generate the first input signal.

10. A semiconductor circuit comprising:
a first logic gate that directly receives inputs of a first input signal, a clock signal and a feedback signal and performs a first logical operation to output a first output signal;
a second logic gate that directly receives inputs of the first input signal and the feedback signal, and performs a second logical operation; and
a third logic gate that receives inputs of the first output signal of the first logic gate, the clock signal and an output signal of the second logic gate and performs a third logical operation to output the feedback signal.

11. The semiconductor circuit of claim 10, wherein:
the first logic gate comprises at least one of a 3 input NAND logic gate and an OR-NAND composite logic gate, and
the third logic gate comprises at least one of a 3 input NAND logic gate and a 2AND-OR-NAND composite logic gate.

12. The semiconductor circuit of claim 10, wherein:
the first logic gate comprises at least one of a 3 input NOR logic gate and an AND-NOR composite logic gate, and
the third logic gate comprises at least one of the 3 input NOR logic gate and a 2OR-AND-NOR composite logic gate.

13. The semiconductor circuit of claim 10, further comprising a fourth logic gate that receives an enable signal and a scan enable signal and performs a fourth logical operation on the enable signal and the scan enable signal to generate the first input signal.

14. The semiconductor circuit of claim 10, further comprising an inverter that receives an input of the first output signal and performs an inversion logical operation to output a second output signal.

15. The semiconductor circuit of claim 10, further comprising a latch that receives inputs of the first output signal and an inverted signal of the clock signal to output a second output signal.

16. The semiconductor circuit of claim 10, further comprising a fourth logic gate that receives a second input signal and a scan enable signal and performs a fourth logical operation on the second input signal and the scan enable signal to generate the first input signal.

17. A semiconductor circuit comprising:
a first logic gate that receives inputs of a second input signal, a clock signal and a feedback signal and performs a second sub-logical operation to output a first output signal, the second input signal being generated by performing a first sub-logical operation on an inverted signal of the first output signal and a first input signal;
a second logic gate that receives inputs of the first input signal and the feedback signal to perform a first logical operation; and
a third logic gate that receives inputs of the first output signal of the first logic gate, the clock signal and an output signal of the second logic gate and performs a second logical operation to output the feedback signal.

18. The semiconductor circuit of claim 17, further comprising an inverter that receives an input of the first output signal and performs an inversion logical operation to output the inverted signal of the first output signal.

19. The semiconductor circuit of claim 17, wherein:
the first logic gate comprises an OR-NAND composite logic gate,
the second logic gate comprises at least one of a NAND logic gate and an OR-NAND composite logic gate, and
the third logic gate comprises at least one of a 3 input NAND logic gate and a 2AND-OR-NAND composite logic gate.

* * * * *